(12) United States Patent
Asai et al.

(10) Patent No.: US 6,835,895 B1
(45) Date of Patent: Dec. 28, 2004

(54) PRINTED WIRING BOARD AND METHOD FOR MANUFACTURING THE SAME

(75) Inventors: Motoo Asai, Gifu (JP); Yasuji Hiramatsu, Gifu (JP)

(73) Assignee: IBIDEN Co., Ltd., Gifu (JP)

( * ) Notice: Subject to any disclaimer, the term of this patent is extended or adjusted under 35 U.S.C. 154(b) by 0 days.

(21) Appl. No.: 09/319,258

(22) PCT Filed: Dec. 18, 1997

(86) PCT No.: PCT/JP97/04684

§ 371 (c)(1),
(2), (4) Date: Jun. 11, 1999

(87) PCT Pub. No.: WO98/27798

PCT Pub. Date: Jun. 25, 1998

(30) Foreign Application Priority Data

| Dec. 19, 1996 | (JP) | ................................................ 8-354971 |
| Dec. 27, 1996 | (JP) | ................................................ 8-357959 |
| Dec. 28, 1996 | (JP) | ................................................ 8-357801 |
| Jan. 28, 1997 | (JP) | ................................................ 9-29587 |
| Jul. 23, 1997 | (JP) | ................................................ 9-197526 |
| Jul. 23, 1997 | (JP) | ................................................ 9-197527 |

(51) Int. Cl.[7] ................................................ H05K 1/03
(52) U.S. Cl. ................ 174/255; 174/264; 174/266; 361/792; 428/209; 428/901
(58) Field of Search ................ 361/792–795; 174/255–257, 260–266, 258, 259; 428/209, 901; 430/269, 270.1; 156/153, 154; 29/831, 846, 847, 852

(56) References Cited

U.S. PATENT DOCUMENTS 3,612,743 A * 10/1971 Angele et al. ................ 174/36
3,996,416 A * 12/1976 Lemke ................ 174/261
4,017,968 A * 4/1977 Weglin ................ 29/853
4,628,598 A * 12/1986 Taylor ................ 29/846

(List continued on next page.)

FOREIGN PATENT DOCUMENTS

| JP | 58-51436 | 11/1983 |
| JP | 63126297 | 5/1988 |
| JP | 3-3297 | 1/1991 |
| JP | 4-55555 | 9/1992 |
| JP | 6283860 | 10/1994 |
| JP | 7231149 | 8/1995 |
| JP | 7-273431 | 10/1995 |
| JP | 8181438 | 7/1996 |
| JP | 8250857 | 9/1996 |
| WO | 96/17503 | 6/1996 |

OTHER PUBLICATIONS

An English Language abstract of JP 8–181438.
An English Language abstract of JP 6–283860.
An English Language abstract of JP 8–250857.
An English Language abstract of JP 7–231149.
An English Language abstract of JP 58–51436.
An English Language abstract of JP 4–55555.
An English Language abstract of JP 63–126297.
English Language Abstract of JP 7–273431, published Oct. 20, 1995.
English Language Abstract of JP–3–3297.

Primary Examiner—David A. Zarneke
Assistant Examiner—Jose H. Alcala
(74) Attorney, Agent, or Firm—Greenblum & Bernstein, P.L.C.

(57) ABSTRACT

A printed circuit board is by formed by laminating an interlaminar insulating layer on a conductor circuit of a substrate, in which the conductor circuit is comprised of an electroless plated film and an electrolytic plated film and a roughened layer is formed on at least a part of the surface of the conductor circuit.

29 Claims, 16 Drawing Sheets

U.S. PATENT DOCUMENTS

| | | | | |
|---|---|---|---|---|
| 4,715,117 A | * | 12/1987 | Enomoto | 29/851 |
| 4,970,107 A | * | 11/1990 | Akahoshi et al. | 428/209 |
| 5,260,518 A | * | 11/1993 | Tanaka et al. | 174/261 |
| 5,322,976 A | * | 6/1994 | Knudsen et al. | 174/262 |
| 5,369,881 A | * | 12/1994 | Inaba et al. | 29/846 |
| 5,495,667 A | * | 3/1996 | Farnworth et al. | 29/843 |
| 5,517,758 A | * | 5/1996 | Nakamura | 29/852 |
| 5,826,330 A | * | 10/1998 | Isoda et al. | 29/852 |
| 5,827,604 A | * | 10/1998 | Uno et al. | 428/209 |
| 5,861,076 A | * | 1/1999 | Adlam et al. | 156/281 |
| 5,879,568 A | * | 3/1999 | Urasaki et al. | 216/18 |
| 5,993,945 A | * | 11/1999 | Russell et al. | 428/209 |
| 6,098,282 A | * | 8/2000 | Frankeny et al. | 29/852 |
| 6,201,193 B1 | * | 3/2001 | Hashimoto | 174/260 |
| 6,204,454 B1 | * | 3/2001 | Gotoh et al. | 174/255 |
| 6,217,987 B1 | * | 4/2001 | Ono et al. | 428/209 |

* cited by examiner

PRINTED WIRING BOARD AND METHOD FOR MANUFACTURING THE SAME

TECHNICAL FIELD

This invention relates to a printed circuit board and a method of producing the same, and more particularly to a printed circuit board which can control the occurrence of cracks in the heat cycle and prevent the dissolution of the conductor circuit caused by roughening of an interlaminar insulating layer without the degradation of peel strength, and a method of producing the same.

BACKGROUND ART

Recently, so-called build-up multilayer wiring board are in demand for high densification of multilayer wiring boards. This build-up multilayer wiring board is produced, for example, by a method as described in JP-B-4-55555. That is, an insulating agent composed of a photosensitive adhesive for electroless plating is applied onto a core substrate, dried, exposed to a light and developed to form an interlaminar insulating resin layer having openings for viaholes, and then the surface of the interlaminar insulating resin layer is roughened by treating with an oxidizing agent or the like, and a plating resist is formed on the roughened surface, and thereafter a non-forming portion of the plating resist is subjected to an electroless plating to form viaholes and conductor circuits, and then such steps are repeated plural times to obtain a build-up multilayer wiring board.

However, in the thus obtained multilayer printed circuit board, the conductor circuit is formed on the non-forming portion of the plating resist and the plating resist remains in the inner layer as it was.

Therefore, if IC chips are mounted on such a wiring board, there is a problem that warping of the board is caused by a difference of thermal expansion coefficient between IC chip and the insulating resin layer in the heat cycle to concentrate stress into aboundary portion between the plating resist and the conductor circuit due to poor adhesion therebetween and hence cracks are generated in the interlaminar insulating layer contacting with the boundary portion.

As a technique capable of solving this problem, there is a method of removing the plating resist retained in the inner layer and forming a roughened layer on the surface of the conductor circuit to provide an adhesion to the interlaminar insulating layer. For example, JP-A-6-283860 discloses a technique of removing the plating resist in the inner layer and providing a roughened layer of copper-nickel-phosphorus on the surface of the conductor circuit composed of an electroless plated film to prevent interlaminar peeling.

In the invention of JP-A-6-283860, however, there is no understanding about cracks caused when the heat cycle test is actually carried out after the mounting of IC chips, and only a conductor circuit composed of only an electroless plated film is disclosed. Moreover, when a supplementary test of the heat cycle at −55° C.~+125° C. is carried out (see Comparative Example 1 as mentioned later), cracking is not observed in about 1000 cycles, but when the cycle number exceeds 1000 cycles, cracking is observed.

As another technique capable of solving the above problem, there is considered a method of adopting so-called semi-additive process to remove the plating resist. In the semi-additive process, however, the conductor circuit is comprised of an electroless plated film and an electrolytic plated film, so that there is a problem that when the surface of the insulating resin layer is subjected to a roughening treatment, a surface portion composed of the electrolytic plated film of the conductor circuit is dissolved by the local electrode reaction.

On the other hand, in order to mount IC chips on the printed circuit board, it is necessary to form a solder bump on the circuit board. As a method of forming the solder bump, there has hitherto been adopted a method wherein an alignment mark composed of a conductor layer is previously formed on a mask for printing such as a metal mask, a plastic mask or the like and a printed circuit board in order to determine positioning of the mask for printing and the printed circuit board, and then both alignment marks are adjusted to each other to laminate the mask for printing on the printed circuit board at a given position, and thereafter a cream solder is printed thereon. In this case, a solder resist layer opening a portion of the alignment mark or the pad for solder bump formation is formed on the printed circuit board.

Therefore, if IC chips are mounted on such a printed circuit board, there is a problem that warping of the board is caused by a difference of thermal expansion coefficient between IC chip and the insulating resin layer in the heat cycle to concentrate stress in a boundary portion between the solder resist layer and the conductor layer (inclusive of the alignment mark and the pad for solder bump formation) due to the absence of adhesion therebetween and hence cracks are generated in the solder resist layer starting from the boundary portion and the solder resist is peeled off.

It is, therefore, an object of the invention to solve the aforementioned problems of the conventional technique.

It is a main object of the invention to provide a printed circuit board capable of effectively preventing cracks and interlaminar peeling of the interlaminar insulating layer created in the heat cycle without degrading other properties, particularly peel strength of conductor (adhesion between a conductor circuit and an interlaminar insulating layer, adhesion between a viahole and an under layer conductor circuit, or adhesion between a conductor layer and a solder resist layer).

It is another object of the invention to provide a printed circuit board capable of preventing the dissolution of the surface of the conductor circuit through the local electrode reaction.

It is still another object of the invention to provide a method of advantageously producing such a printed circuit board.

DISCLOSURE OF THE INVENTION

The inventors have made various studies in order to achieve the above objects and as a result the invention lying in the following constructions has been accomplished.

(1) The printed circuit board according to the invention is a printed circuit board formed by laminating an interlaminar insulating layer on a conductor circuit of a substrate and repeating formation of conductor circuit and an interlaminar insulating layer, characterized in that the conductor circuit is comprised of an electroless plated film and an electrolytic plated film, and a roughened layer is formed on at least a part of the surface of the conductor circuit.

(2) The printed circuit board according to the invention is a printed circuit board formed by laminating an interlaminar insulating layer on a conductor circuit of a substrate and repeating formation of conductor circuit and an interlaminar insulating layer, characterized in that the conductor circuit is comprised of an electroless plated film and an electrolytic plated film, and a roughened layer is formed on at least a part of the surface of the conductor circuit, and the surface of the roughened layer is covered with a layer of a metal having an ionization tendency of more than copper but less than titanium or a noble metal.

In the printed circuit board described in the item (1) or (2), it is preferable that the roughened layer is formed on at least a part of the surface inclusive of a side surface of the conductor circuit and that the roughened layer is a plated layer of copper-nickel phosphorus alloy.

(3) A method of producing the multilayer printed circuit board according to the invention comprises subjecting a surface of a substrate to an electroless plating, forming a plating resist thereon, subjecting the substrate to an electrolytic plating, removing the plating resist, etching and removing the electroless plated film beneath the plating resist to form a conductor circuit comprised of the electroless plated film and the electrolytic plated film, forming a roughened layer on at least a part of the surface of the conductor circuit and then forming an interlaminar insulating layer thereon.

(4) A method of producing the multilayer printed circuit board according to the invention comprises subjecting a surface of a substrate to an electroless plating, forming a plating resist thereon, subjecting the substrate to an electrolytic plating, removing the plating resist, etching and removing the electroless plated film beneath the plating resist to form a conductor circuit comprised of the electroless plated film and the electrolytic plated film, forming a roughened layer on at least a part of the surface of the conductor circuit, covering the surface of the roughened layer with a layer of a metal having an ionization tendency of more than copper but less than titanium or a noble metal and forming an interlaminar insulating layer thereon.

In the method described in item (3) or (4), the roughened layer is preferably formed by plating of copper-nickel-phosphorus alloy.

(5) The printed circuit board according to the invention is a multilayer printed circuit board comprising a substrate provided with an under layer conductor circuit, an interlaminar insulating layer formed thereon and an upperlayer conductor circuit formed on the interlaminar insulating layer, and a viahole connecting both the conductor circuits to each other, in which the viahole is comprised of an electroless plated film and an electrolytic plated film, and a roughened layer having an roughened surface formed by etching treatment, polishing treatment, or redox treatment, or having a roughened surface formed by a plated film is formed on at least a part of the surface of the lower layer conductor circuit connecting to the viahole.

In the printed circuit board described in item (5), the roughened layer is preferably formed by plating of copper-nickel-phosphorus alloy.

(6) A method of producing the multilayer printed circuit board according to the invention comprises forming an under layer conductor circuit on a surface of a substrate, forming a roughened layer by an etching treatment, polishing treatment, redox treatment, or a plating treatment on at least a part of a surface of the under layer conductor circuit to be connected to a viahole, forming an interlaminar insulating layer thereon, and forming openings for viaholes in the interlaminar insulating layer, subjecting the interlaminar insulating layer to an electroless plating, forming a plating resist thereon and subjecting the substrate to an electrolytic plating, removing the plating resist, etching and removing the electroless plated film beneath the plating resist to form an upperlayer conductor circuit comprised of the electroless plated film and the electrolytic plated film and a viahole. film beneath the plating resist to form an upperlayer conductor circuit comprised of the electroless plated film and the electrolytic plated film and a viahole.

In the method described in item (6), the roughened layer is preferably formed by plating of copper-nickel-phosphorus alloy.

(7) A printed circuit board provided with a conductor layer used as an alignment mark, in which a roughened layer is formed on at least a part of the surface of the conductor layer.

In the printed circuit board described in item (7), the conductor layer is preferably comprised of an electroless plated film and an electrolytic plated film.

(8) A printed circuit board provided with a conductor layer used as an alignment mark, in which the conductor layer is comprised of an electroless plated film and an electrolytic plated film.

In the printed circuit board described in item (8), it is preferable that the roughened layer is formed on at least a part of the surface of the conductor layer.

In the printed circuit board described in item (7) or (8), it is preferable that the alignment mark is an opening portion formed by exposing only the surface of the conductor layer from a solder resist formed on the conductor layer, and it is preferable that a metal layer of nickel-gold is formed on the conductor layer exposed from the opening portion.

Further, in the printed circuit board described in item (7) or (8), it is preferable that the alignment mark is used for positioning to a printed mask, an IC chip mounting and positioning in the mounting of a printed circuit board packaged a semiconductor element to another printed circuit board.

BRIEF EXPLANTION OF THE DRAWINGS

Figure 1:
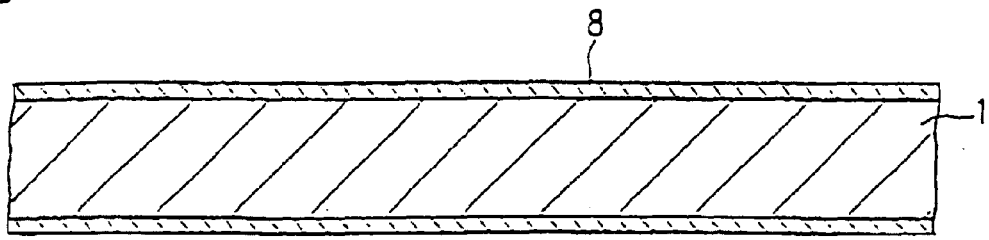
FIGS. 1–19 are flow charts showing production steps of a printed circuit board in Example 1.
Figure 2:
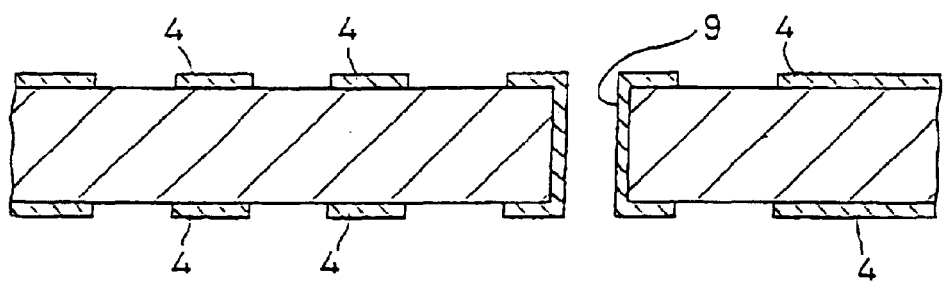

In these drawings, numeral 1 is a substrate, numeral 2 an interlaminar insulating resin layer (an adhesive layer for electroless plating), numeral 2a an insulating layer, numeral 2b an adhesive layer, numeral 3 a plating resist, numeral 4 an inner layer conductor circuit (an inner layer copper pattern), numeral 5 an outer layer conductor circuit (an outer layer copper pattern), numeral 6 an opening for viahole, numeral 7 a viahole (BVH), numeral 8 a copper foil, numeral 9 a through-hole, numeral 10 a filling resin (a resin filler), numeral 11 a roughened layer, numeral 12 an electroless copper plated film, numeral 13 an electrolytic copper plated film, numeral 14 a solder resist layer, numeral 15 a nickel plated layer, numeral 16 a gold plated layer, numeral 17 a solder bump (a solder body), numeral 18 an alignment mark (used for positioning to a printed mask), numeral 19 an alignment mark (used for positioning to an IC chip mounting), numeral 20 an alignment mark (used for positioning in the mounting of a printed circuit board packaged a semiconductor element to another printed circuit board), numeral 21 a pad for solder bump formation, numeral A a product portion.

BEST MODE FOR CARRYING OUT THE INVENTION

①. The printed circuit board according to the invention lies in a point that the conductor circuit is comprised of an electrolytic plated film and an electroless plated film, and the electroless plated film is located at an inner layer side and the electrolytic plated film is located at an outer layer side (see enlarged views of FIG. 18 and FIG. 19).

In such a structure, since the electrolytic plated film is softer and more malleable than the electroless plated film, the conductor circuit is able to follow size change of the interlaminar insulating resin layer as an upper layer even if warping of the board is generated in the heat cycle. Moreover, in the printed circuit board according to the invention, since the roughened layer is formed on the surface of the conductor circuit, the conductor circuit is strongly adhered to the interlaminar insulating resin layer as an upper layer and more readily follows size change of the interlaminar insulating resin layer.

Particularly, it is advantageous to form the roughened layer on at least a side face of the conductor circuit, which can control cracks generated in the interlaminar insulating resin layer starting from the boundary portion between the side face of the conductor circuit and the interlaminar resin contacted therewith.

②. The printed circuit board according to the invention lies in a point that the viahole is comprised of an electrolytic plated film and an electroless plated film, and the electroless plated film is located at an inner layer side and the electrolytic plated film is located at an outer layer side (see enlarged views of FIG. 18 and FIG. 19).

In such a structure, since the electrolytic plated film is softer and more malleable than the electroless plated film, the viahole is able to follow size change of the interlaminar insulating resin layer as an upper layer even if a warp of the board is generated in the heat cycle. Moreover, the viahole in the printed circuit board according to the invention is constructed at the inner layer side with the hard electroless plated film and also such an electroless plated film is adhered to the under layer conductor circuit through the roughened layer, so that the viahole is not peeled off from the under layer conductor circuit in the heat cycle. Because the metal layer encroached by the roughened layer is the harder electroless plated film, and hence breakage at the metal layer is rarely caused even when peeling force is applied.

In short, when the viahole is comprised of only the electrolytic plated film, even if it is adhered to the under layer conductor circuit through the roughened layer, the electrolytic plated film itself is soft and is apt to peel off due to the heat cycle. While, when the viahole is comprised of only the electroless plated film, it can not follow size change of the interlaminar insulating resin layer and hence cracking is caused in the interlaminar insulating resin layer on the viahole. In the printed circuit board according to the invention, the viahole is comprised of the electrolytic plated film and the electroless plated film and connected to the under layer conductor circuit through the roughened layer, so that the occurence of cracks generated in the interlaminar insulating resin layer on the viahole, and peeling between the viahole and the under layer conductor circuit in the heat cycle can be prevented at the same time.

Moreover, when the interlaminar insulating resin layer is roughened, it is desirable that a plated film encroached into the roughened layer is hard. Because breakage is rarely caused at the plated film portion when peeling force is applied.

In structure ②, the roughened layer may be formed on the surface of the viahole. Because the roughened layer is strongly adhered to the interlaminar insulating resin layer as an upper layer and hence the viahole is more able to follow size change of the interlaminar insulating resin layer. Further, the roughened layer on the under layer conductor circuit may be formed on not only the portion connecting to the viahole but also the whole surface of the under layer conductor circuit. The adhesion of the under layer conductor circuit to the interlaminar insulating resin layer is improved like the above structure ①.

In structure ②, it is desirable that the under layer conductor circuit connecting to the viahole is comprised of the electrolytic plated film and the electroless plated film, and the electroless plated film is located at an inner layer side and the electrolytic plated film is located at an outer layer side. Because the inner layer side of the under layer conductor circuit is adhered to the interlaminar insulating resin layer, it is desirably a hard electroless plated film in order to ensure peel strength, while the contrary side is connected to the viahole and is desirably an electrolytic plated film having an excellent following property to size change.

③. The printed circuit board according to the invention lies in a point that the roughened layer is formed on at least a part of the surface of the conductor layer as an alignment mark used for positioning to a printed mask or an IC chip mounting and as an alignment mark used for mounting a packaged board obtained by mounting a semiconductor element onto another printed circuit board (see enlarged view of FIG. 41).

When a peripheral edge of the conductor layer is covered with the solder resist layer (that is, in case of exposing only the conductor layer from an opening of the solder resist layer), peeling of the solder resist layer is not caused and the function of the conductor layer as an alignment mark is not lowered.

④. The printed circuit board according to the invention lies in a point that the conductor layer as an alignment mark is comprised of the electrolytic plated film and the electroless plated film, and the electroless plated film is located at an inner layer side and the electrolytic plated film is located at an outer layer side, and the alignment mark is used for positioning to a printed mask or an IC chip mounting and for mounting the packaged board obtained by mounting a semiconductor element to another printed circuit board (see enlarged view of FIG. 41).

In such a structure, since the electrolytic plated film is softer and more malleable than the electroless plated film, the conductor layer is able to follow size change of the solder resist layer as an upper layer even if warping of the board is generated in a heat cycle. Moreover, when the roughened layer is formed on the surface of the conductor layer, the conductor layer is strongly adhered to the solder resist layer as an upper layer and is able to follow size change of the solder resist layer. Further, the conductor contacting with the interlaminar insulating layer is an electroless plated film and high in the hardness, and hence peel strength can be increased.

Particularly, it is advantageous to form the roughened layer on at least a side face of the conductor layer, which can control cracks generated in the solder resist layer or the like starting from a boundary between the side face of the conductor layer and the solder resist layer contacting therewith in the heat cycle.

In structures ③ and ④, it is further desirable that the metal layer made of nickel-gold is formed on the conductor layer as an alignment mark exposed from the opening portion. Because gold is high in reflectance and advantageously functions as an alignment mark. The metal layer made of nickel-gold may be formed by electroless plating. For example, the nickel layer is comprised of a nickel plated film having a thickness of 5 μm, and the gold layer is comprised of a flash gold plated film having a thickness of 0.1 μm or a thick gold plated film having a thickness of 0.5 μm.

Figure 41:
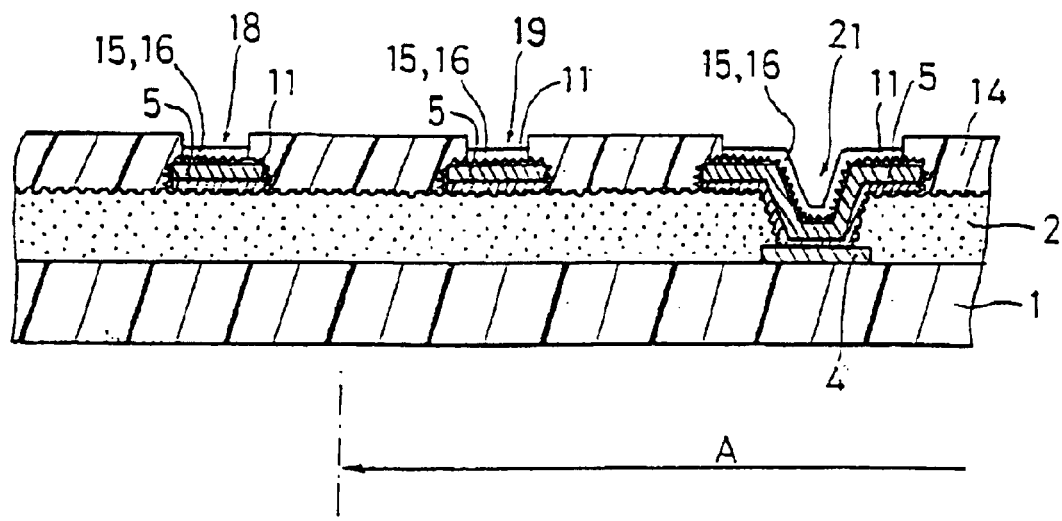
FIG. 41 is a partial sectional view showing an alignment mark composed of a conductor layer and used for positioning to a printed mask or an IC chip mounting.
Figure 42:
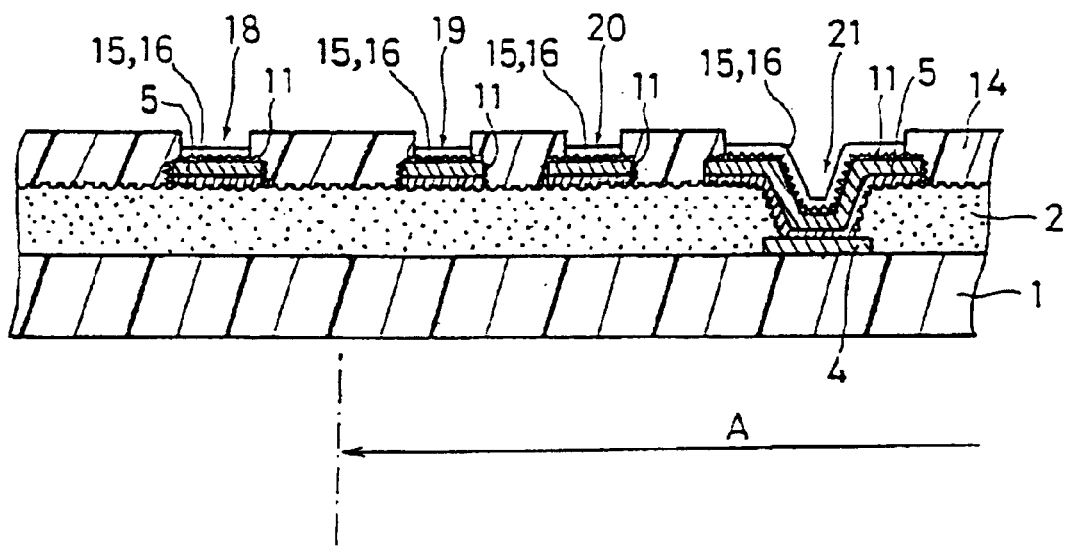
FIG. 42 is a partial sectional view showing an alignment mark composed of a conductor layer and used for positioning in the mounting of a printed circuit board packaged a semiconductor element to another printed circuit board.
Figure 43:
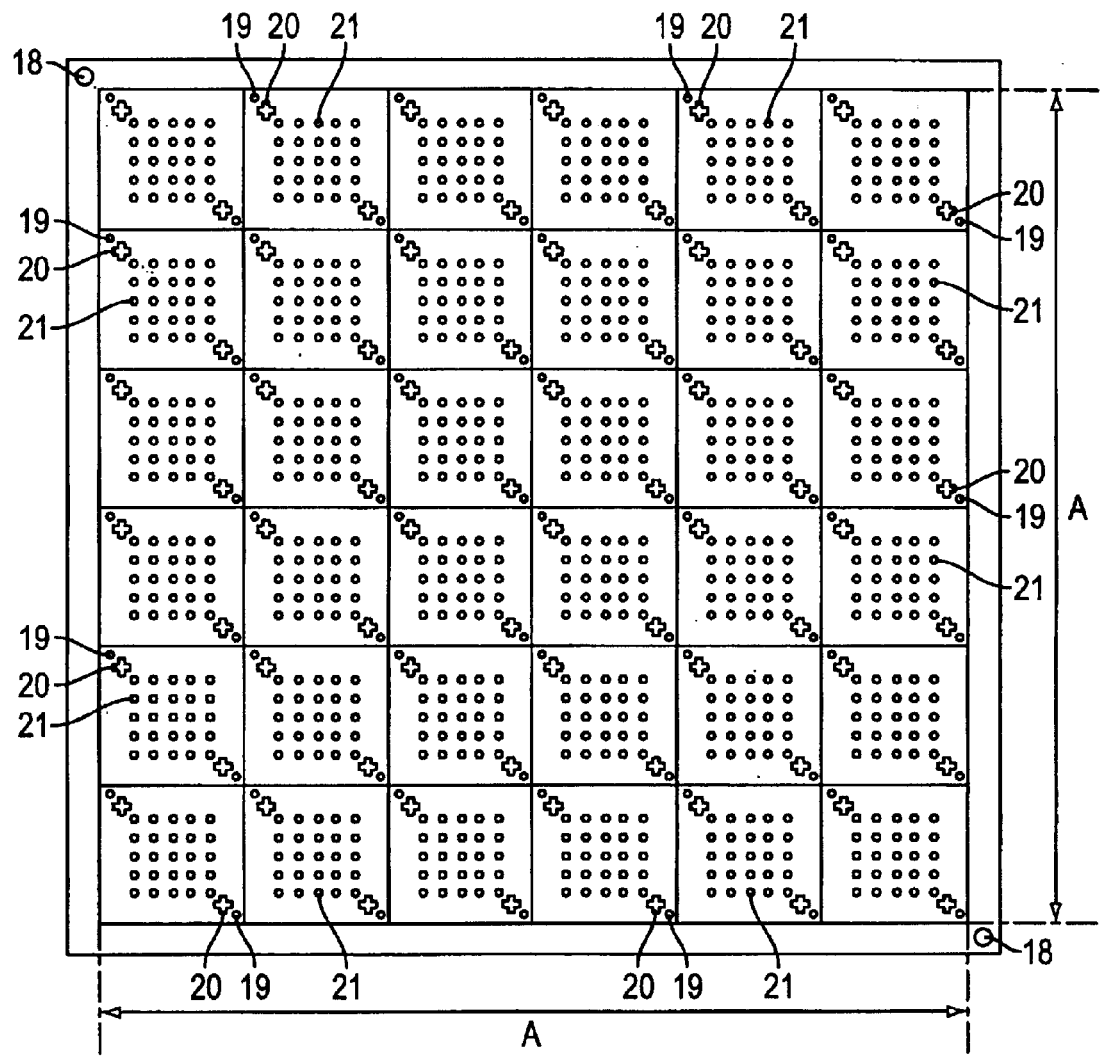
FIG. 43 is a plane view of a printed circuit board.

In structures ③ and ④, as shown in FIG. 41, the printed circuit board is comprised, for example, of an insulating substrate 1, a first layer conductor circuit 4 and an interlaminar insulating layer 2 (an adhesive layer for electroless plating) formed thereon, a pad (a conductor pattern) 21 for a solder bump formation comprising a part of a second layer conductor circuit, an alignment mark 18 for positioning to a printed mask and an alignment mark 19 for an IC chip mounting formed on the interlaminar insulating agent 2 through semi-additive process, a solder resist layer 14 formed on a portion other than the alignment mark 18, 19 and the pad 21 for the solder bump formation. The alignment mark 18 for positioning to the printed mask is formed on a portion forming no conductor pattern in the vicinity of an outer peripheral portion of the printed circuit board. Concretely, it is formed, for example, on an outside of a product portion A shown in FIG. 41. Therefore, the alignment mark 19 for the IC chip mounting enables an IC chip mounting without influence of the mark 18. In this case, the vicinity of the outer peripheral portion means an outside portion of the product portion as above mentioned. Further, the alignment mark 19 for the IC chip mounting is formed on each product portion in the printed circuit boards in order to mount an IC chip on each C, product portion. Further, in case of mounting a semiconductor element to produce a packaged board, C, the alignment mark 20 used for mounting the packaged board to another printed circuit board is formed on the innermost side as shown FIG. 42. The alignment mark 20 is desirably a cross-shaped mark as shown FIG. 43. In case of adopting the cross-shaped mark, an opening of a solder resist layer is formed so as to cover the peripheral edge of the cross.

Particularly, the alignment marks 18, 19 are preferably formed in the opening portions exposing only the surface of the conductor layer from the solder resist layer formed on the conductor layer (including the viahole). Because the peripheral edge of the conductor layer overlaps with the solder resist layer and hence the peeling of the conductor can be prevented by holding the conductor with the solder resist layer as shown FIG. 41. Moreover, in the heat cycle, cracks generated starting from the boundary portion between the conductor layer and the interlaminar insulating resin layer due to the difference of thermal expansion coefficient can be controlled. As can be seen, the alignment mark is electrically isolated from the conductor layer.

Particularly, the alignment mark for positioning to a printed mask has the following effect.

The opening of the solder resist layer is formed by placing a photomask film and subjecting to light exposure and developing treatments. If the position of the photomask is shifted, the position of the opening is also shifted.

If the conductor layer as an alignment mark is perfectly exposed, since a center of the conductor is recognized as the central position of the alignment mark in a camera, position shifting of the opening in the solder resist layer cannot be recognized. As a result, the opening portion of the printed mask is not coincident with the opening portion of the solder resist layer, so that an opening volume of the printed mask is decreased due to the solder resist layer and the height of a solder bump becomes low.

On the other hand, if the peripheral edge of the conductor layer as an alignment mark is covered with the solder resist layer, since a center of the conductor exposed from the opening portion is recognized as the central position of the alignment mark in a camera, even if the photomask for opening the solder resist layer is shifted to cause position shifting of the opening in the solder resist layer, the alignment mark is shifted in the same direction and amount as mentioned above. As a result, the opening portion of the printed mask is coincident with the opening portion of the solder resist layer, so that an opening volume of the printed mask is not decreased due to the solder resist layer and the height of a solder bump is not lowered.

In FIG. 41, the pad 21 for the solder bump formation (conductor pattern) may be covered with the opening peripheral edge of the solder resist layer or may perfectly be exposed in the opening portion.

As mentioned above, in the above structures ①, ②, ④ of the printed circuit board according to the invention, the inner layer side of the conductor is constructed with the electroless plated film which is harder than the electrolytic plated film, and hence the peel strength is never lowered. Because the higher the hardness of the portion contacting with an interlaminar insulating layer and located in the inner layer side of the conductor circuit (in case of adopting an adhesive for electroless plating as mentioned later as an interlaminar insulating layer, the portion contacting with a roughened surface), the higher the peel strength. Even when the printed circuit board according to the invention is mounted with an IC chip and subjected to a heat cycle test under −55° C. ~125° C., the occurrence of cracks generated in the interlaminar insulating resin layer starting from the conductor circuit or the viahole, and cracks generated in the solder resist layer starting from the boundary between the side face of the conductor layer and the solder resist layer contacting therewith can be prevented, and also the peeling of the conductor circuit, the viahole or the solder reist layer is not observed.

Moreover, the printed circuit board having such a structures ①~④ can easily be produced by the production method according to the invention mentioned later (semi-additive process).

In the invention, it is desirable that the roughened layer formed on the surface of the conductor circuit, the surface of the viahole or the surface of the conductor layer for an alignment mark is a roughened surface of copper formed by an etching treatment, a polishing treatment, or a redox treatment, or a roughened surface of a plated film formed by subjecting to a plating treatment.

Particularly, it is desirable that the roughened layer is an alloy layer composed of copper-nickel-phosphorus. Because the alloy layer is a needle-shaped crystal layer and is excellent in adhesion to the solder resist layer. Further, the alloy layer is electrically conductive, and hence even if the solder body is formed on the surface of the pad, the removal of the alloy layer is not necessary.

The composition of the alloy layer is desirably 90–96 wt % of copper, 1–5 wt % of nickel and 0.5–2 wt % of phosphorus because the needle-shaped structure is obtained in such a composition ratio.

Figure 18:
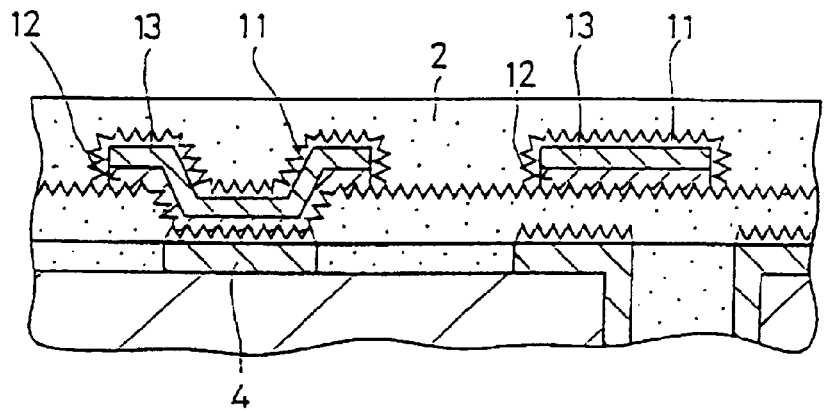
Figure 19:
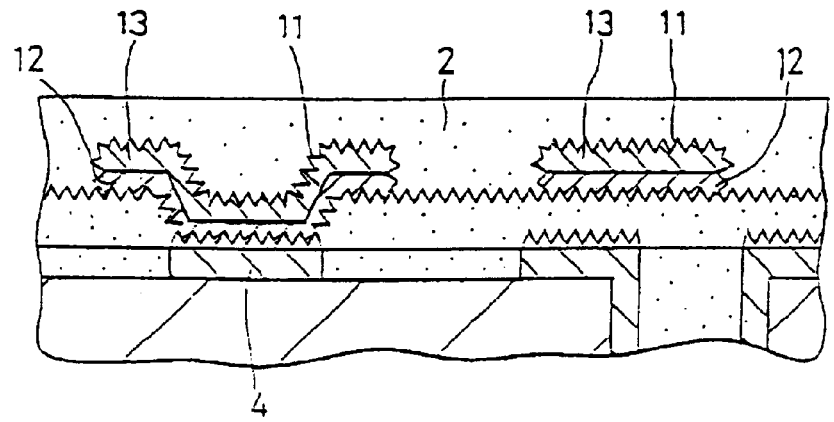
Figure 20:
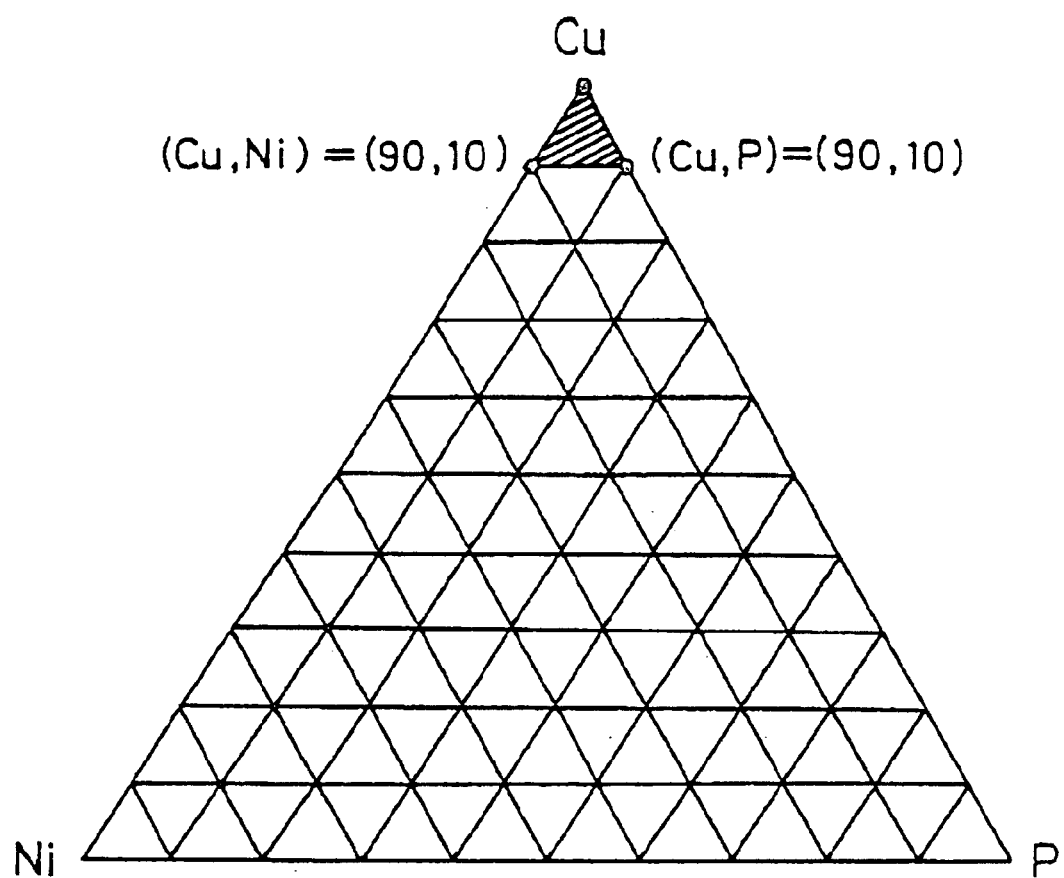
FIG. 20 is a triangular diagram showing a composition of copper-nickel-phosphorus roughened layer.

Moreover, FIG. 18 is a triangular diagram of three components showing a composition of copper-nickel-phosphorus capable of forming the needle-shaped crystal. In this figure, the range surrounded by (Cu, Ni, P)=(100, 0, 0), (90, 10, 0), (90, 0, 10) is preferable.

When the roughened layer is formed by the oxidation treatment, it is desirable to use a solution of an oxidizing agent comprising sodium chlorite, sodium hydroxide and sodium phosphate.

When the roughened layer is formed by the redox treatment, it is desirably carried out by immersing a solution of a reducing agent comprising sodium hydroxide and sodium borohydride after the above oxidation treatment.

The roughened layer formed on the surface of the conductor circuit desirably has a thickness of 0.5–10 $\mu$m, preferably 0.5–7 $\mu$m. Because, if the thickness is too thick, the roughened layer itself is apt to be damaged and peeled, while if it is too thin, adhesion is lowered.

In the invention, the electroless plated film constituting the conductor circuit desirably has a thickness of 0.1–51 $\mu$m, preferably 0.5–3 $\mu$m. Because, if the thickness is too thick, the ability to follow the interlaminar insulating resin layer lowers, while if it is too thin, degradation of peel strength is caused and electric resistance becomes large in the case of being subjected to an electrolytic plating to cause scattering in the thickness of the plated film.

Furthermore, the electrolytic plated film constituting the conductor circuit desirably has a thickness of 5–30 $\mu$m, preferably 10–20 $\mu$m. Because, if the thickness is too thick, degradation of peel strength is caused, while if it is too thin, the ability to follow the interlaminar insulating resin layer lowers.

Thus, in the invention, the conductor circuit is comprised of the electrolytic plated film and the electroless plated film, and the roughened layer formed on the surface of the conductor circuit mainly contacts with the electrolytic plated film. The electrolytic plated film is apt to be dissolved by local electrode reaction as compared with the electroless plated film, so that when the electrolytic plated film forms the local electrode with the roughened layer, it is rapidly dissolved and hence a large hole is apt to be formed in the surface of the conductor circuit. In the invention, therefore, it is particularly desirable that the surface of the roughened layer is covered with a layer of a metal having an ionization tendency of more than copper but less than titanium or a noble metal, which is another feature in this point. Thus, the dissolution of the conductor circuit through the local electrode reaction can be controlled.

As the metal having an ionization tendency not lower than that of copper but not higher than that of titanium, there is at least one metal selected from the group consisting of titanium, aluminum, zinc, iron, indium, thallium, cobalt, nickel, tin, lead and bismuth.

As the noble metal, there is at least one metal selected from the group consisting of gold, silver and platinum.

Such a metal or noble metal layer covering the roughened layer can prevent the dissolution of the conductor circuit through the local electrode reaction caused in the roughening of the interlaminar insulating layer.

Such a metal or noble metal layer desirably has a thickness of 0.1–2 $\mu$m.

Among such a metal or noble metal, tin is preferable. Tin can form a thin layer through an electroless substitution plating and can advantageously follow the roughened layer.

In the invention, it is desirable that the roughened layer is formed on at least a side face of the conductor circuit. Because cracks generated in the interlaminar insulating resin layer due to the heat cycle result from the bad adhesion between the side face of the conductor circuit and film the insulating resin layer, but in such a structure according to the invention, the cracks generated in the interlaminar insulating resin layer starting from the boundary between the side face of the conductor circuit and the insulating resin layer can be prevented.

In the invention, it is desirable that the adhesive for electroless plating is used as the interlaminar insulating resin layer constituting the above wiring substrate. The adhesive for electroless plating is optimum to be obtained by dispersing cured heat-resistant resin particles soluble in acid or oxidizing agent into an uncured heat-resistant resin hardly soluble in acid or oxidizing agent through curing.

Because, the heat-resistant resin particles can be dissolved and removed by treating with an acid or an oxidizing agent to form a roughened surface of octopus-trap shaped anchors on its surface.

In the adhesive for electroless plating, the cured heat-resistant resin particles are desirable to be selected from ① heat-resistant resin powder having an average particle size of not more than 10 $\mu$m, ② aggregated particles formed by aggregating heat-resistant resin powder having an average particle size of not more than 2 $\mu$m, ③ a mixture of heat-resistant resin powder having an average particle size of 2–10 $\mu$m and heat-resistant resin powder having an average particle size of not more than 2 $\mu$m, ④ false particles formed by adhering at least one of heat-resistant resin powder and inorganic powder having an average particle size of not more than 2 $\mu$m onto surfaces of heat-resistant resin powder having an average particle size of 2–10 $\mu$m, and ⑤ a mixture of heat-resistant resin powder having an average particle size of 0.1–0.8 $\mu$m and heat-resistant resin powder having an average particle size of more than 0.8 $\mu$m but less than 2 $\mu$m because they can form complicated anchor.

A method of producing the printed circuit board according to the invention will be described below.

(1) At first, a wiring substrate is prepared by forming an inner layer copper pattern on a surface of a core substrate.

The copper pattern of the wiring substrate is formed by a method of etching a copper-clad laminate, or a method of forming an adhesive layer for electroless plating on a substrate such as glass epoxy substrate, polyimide substrate, ceramic substrate, metal substrate or the like and roughening the surface of the adhesive layer and subjecting the roughened surface to an electroless plating, or so-called semi-additive process (the whole of the roughened surface is subjected to an electroless plating and then a plating resist is formed thereon and a portion not forming the plating resist is subjected to an electrolytic plating and the plating resist is removed and etched to form a conductor circuit comprised of an electrolytic plated film and an electroless plated film).

If necessary, a roughened layer of copper-nickel-phosphorus is further formed on the copper pattern surface of the wring substrate.

The roughened layer is formed by an electroless plating. The composition of the electroless plating aqueous solution desirably has a copper ion concentration of $2.2\times10^{-2}$~$4.1\times10^{-2}$ mol/l, a nickel ion concentration of $2.2\times10^{-3}$~$4.1\times10^{-3}$ moy/l and a hypophosphorus acid ion concentration of 0.20~0.25 mol/l.

The film deposited within the above range has a needle in crystal structure and is excellent in the anchor effect. The electroless plating aqueous solution may be added with a complexing agent and additives in addition to the above compounds.

As the other method of forming the roughened layer, there are oxidation-reduction treatment, a method of etching copper surface along grain boundary to form a roughened layer and the like.

Moreover, through-holes are formed in the core substrate, and the front and back wiring layers may be electrically connected to each other through the through-holes.

And also, a resin may be filled in the through-holes and between the conductor circuits of the core substrate to ensure the smoothness thereof (see FIGS. 1–4).

Then, an interlaminar insulating resin layer is forme on the printed wiring substrate prepared in step (1)

Figure 5:
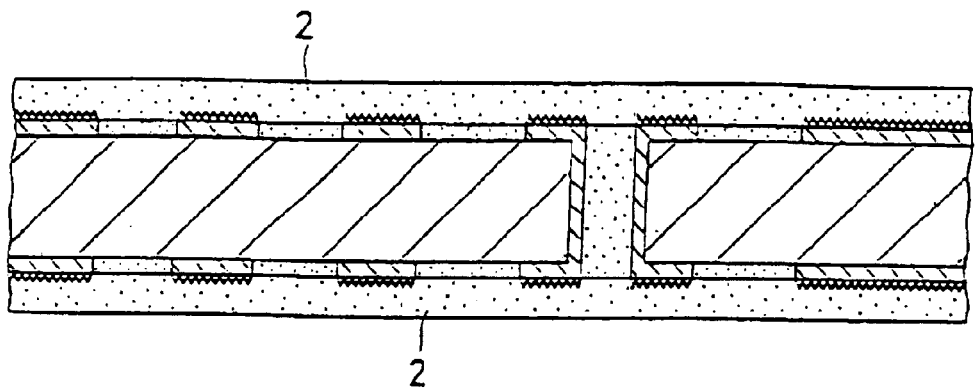

In the invention, it is particularly desirable to use an adhesive for electroless plating as the interlaminar insulating resin material (see FIG. 5).

(3) After the adhesive layer for electroless plating formed in step (2) is dried, an opening portion for the formation of viahole is formed, if necessary.

Figure 6:
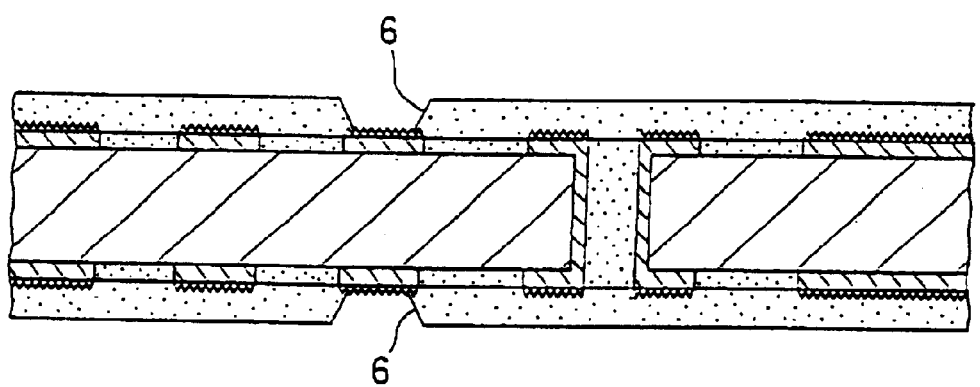

The opening portion for the formation of viahole is formed in the adhesive layer by light exposure, development and thermosetting in the case of photosensitive resin, or by thermosetting and laser working in the case of thermosetting resin (see FIG. 6).

Figure 7:
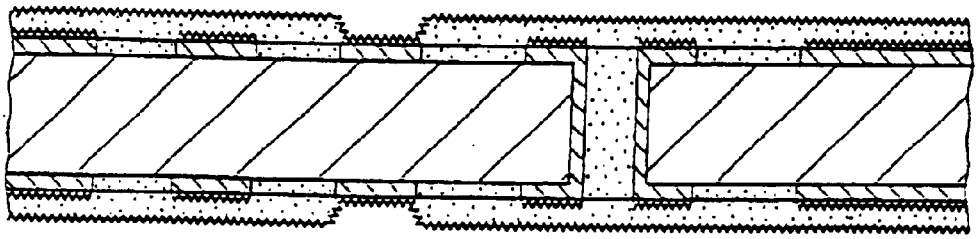

(4) Then, epoxy resin particles existing on the surface of the cured adhesive layer are dissolved and removed with an acid or an oxidizing agent to roughen the surface of the adhesive layer (see FIG. 7).

As the acid, there are phosphoric acid, hydrochloric acid, sulfuric acid, and an organic acid such as formic acid, acetic acid or the like. Particularly, the use of the organic acid is desirable because it hardly corrodes the metal conductor circuit exposed from the viahole by the roughening treatment.

As the oxidizing agent, it is desirable to use chromic acid, permanganate (potassium permanganate or the like) and so on.

(5) Then, a catalyst nucleus is applied to the wiring substrate provided with the roughened surface of the adhesive layer.

In the application of the catalyst nucleus, it is desirable to use a noble metal ion, a noble metal colloid or the like. In general, palladium chloride or palladium colloid is used. Moreover, it is desirable to conduct a heating treatment for fixing the catalyst nucleus. As the catalyst nucleus, palladium is favorable.

Figure 8:
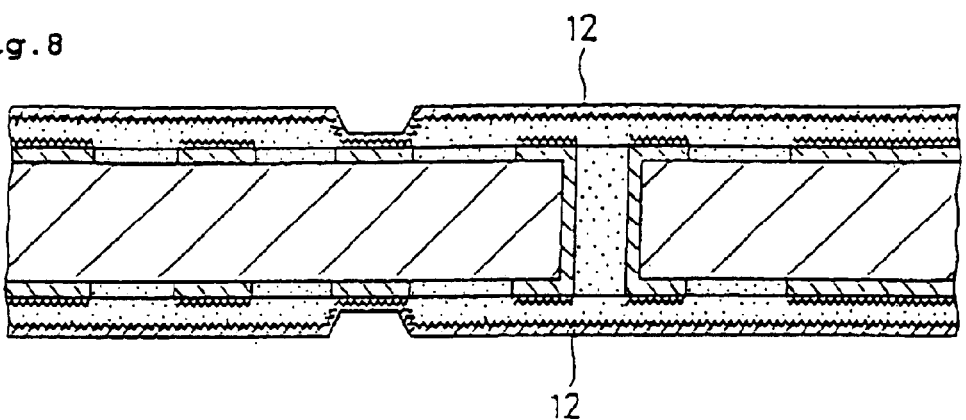

(6) Then, the surface of the adhesive layer for electroless plating is subjected to an electroless plating to form an electroless plated film on the whole of the roughened surface (see FIG. 8). In this case, the thickness of the electroless plated film is 0.1~5 μm, more particularly 0.5~3 μm.

Figure 9:
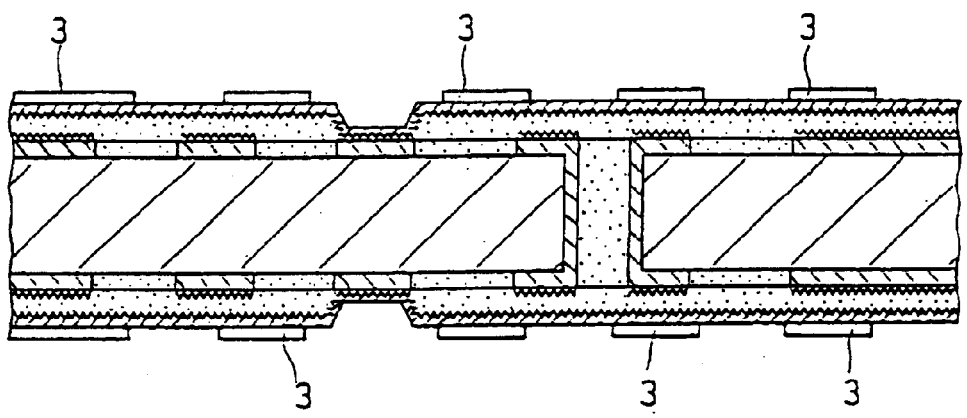

Then, a plating resist is formed on the electroless plated film (see FIG. 9). As the plating resist, it is particularly desirable to use a composition comprised of an imidazole curing agent and an acrylate of cresol type epoxy resin, phenol novolac type epoxy resin or the like, but use may be made of commercially available products.

Figure 10:
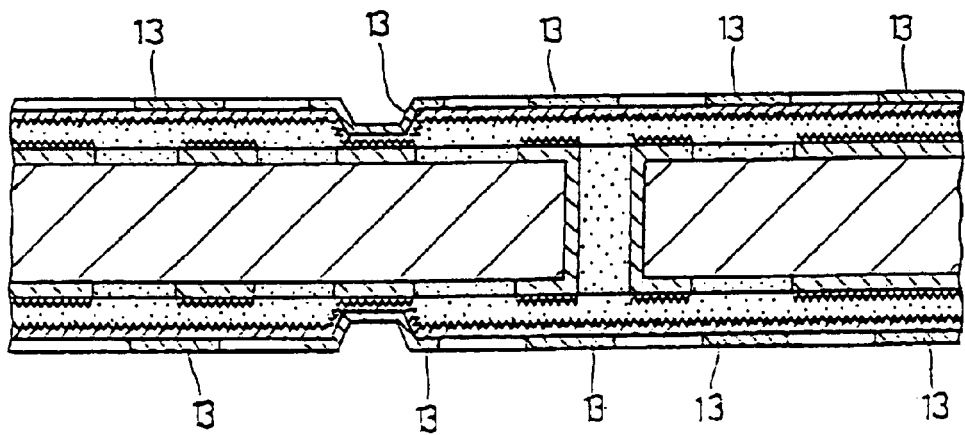

(7) Then, a portion not forming the plating resist is subjected to an electrolytic plating to form conductor circuits and viaholes (see FIG. 10). In this case, it is desirable that the thickness of the electrolytic plated film is 5~30 μm.

As the electrolytic plating, it is desirable to use an electrolytic copper plating.

Figure 11:
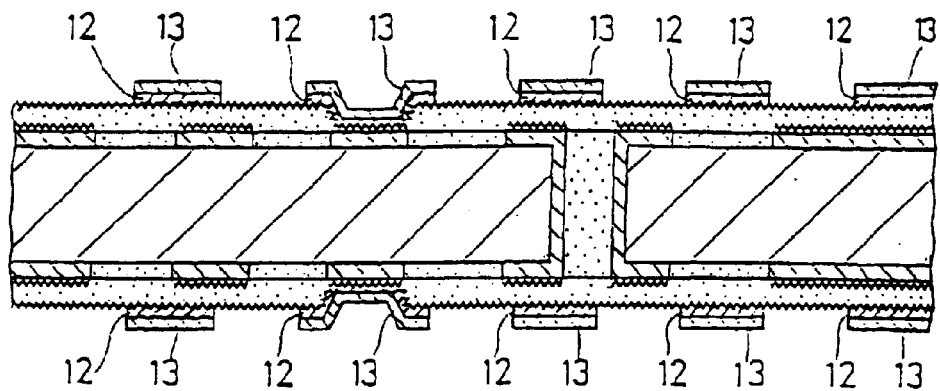

(8) After the plating resist is removed, the electroless plated film beneath the plating resist is removed by dissolving in an etching solution such as a mixture of sulfuric acid and hydrogen peroxide, sodium persulfate, ammonium persulfate or the like to obtain an independent conductor circuit (see FIG. 11).

Figure 12:
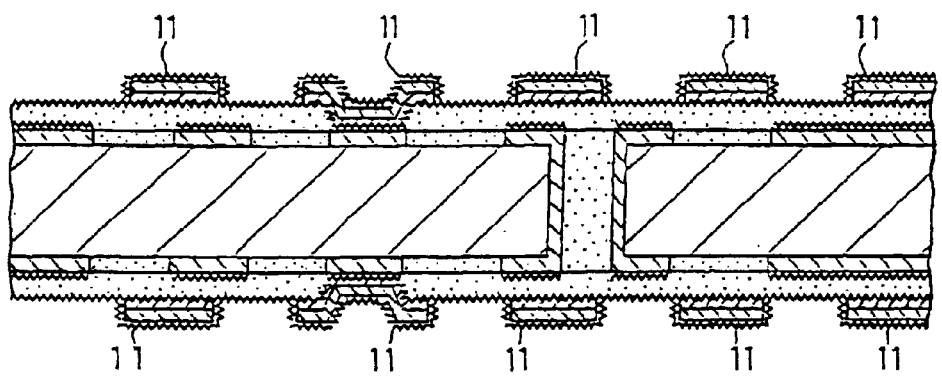
Figure 13:
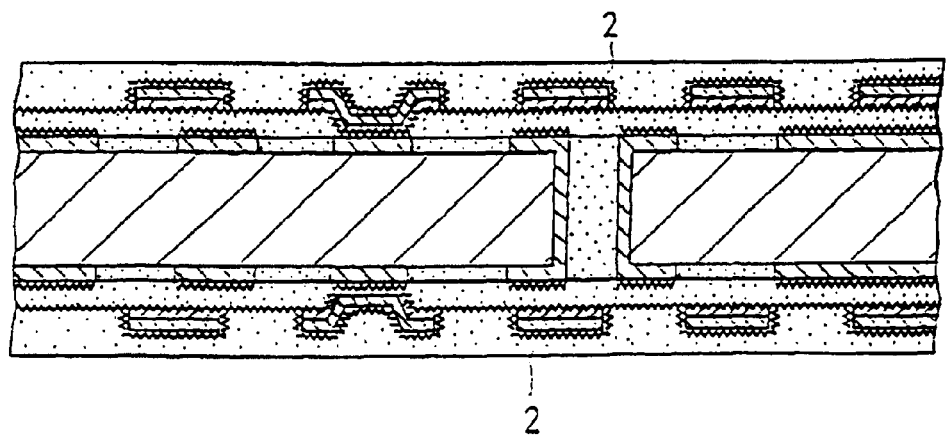
Figure 14:
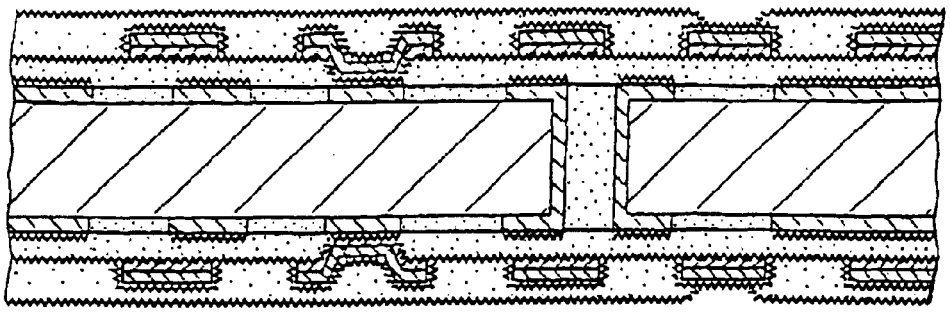
Figure 15:
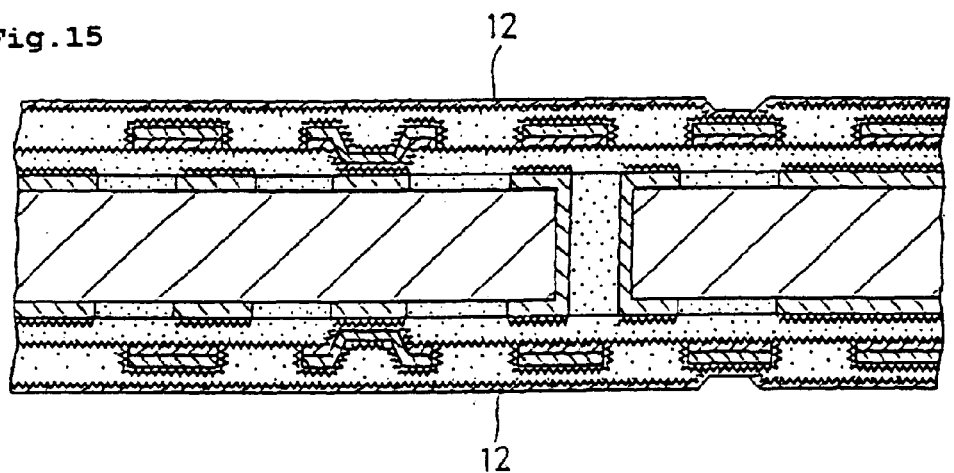
Figure 16:
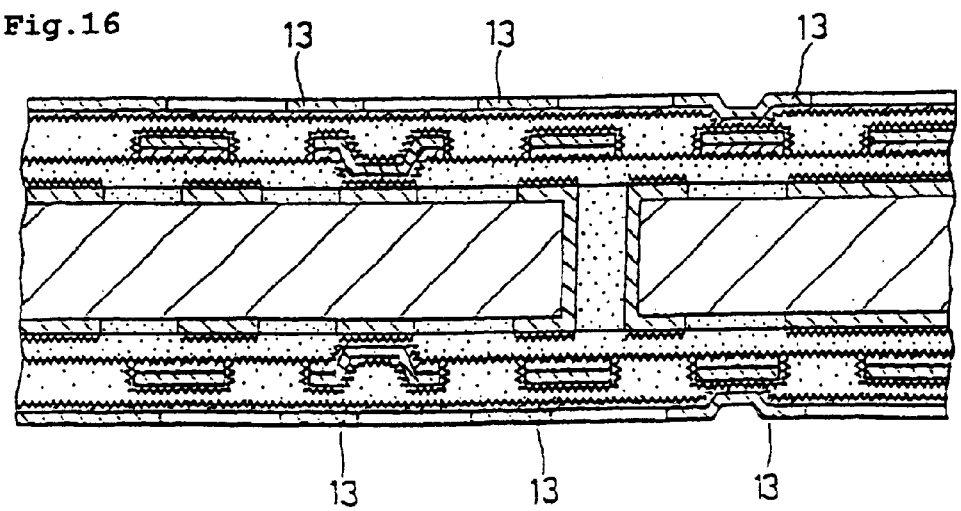
Figure 17:
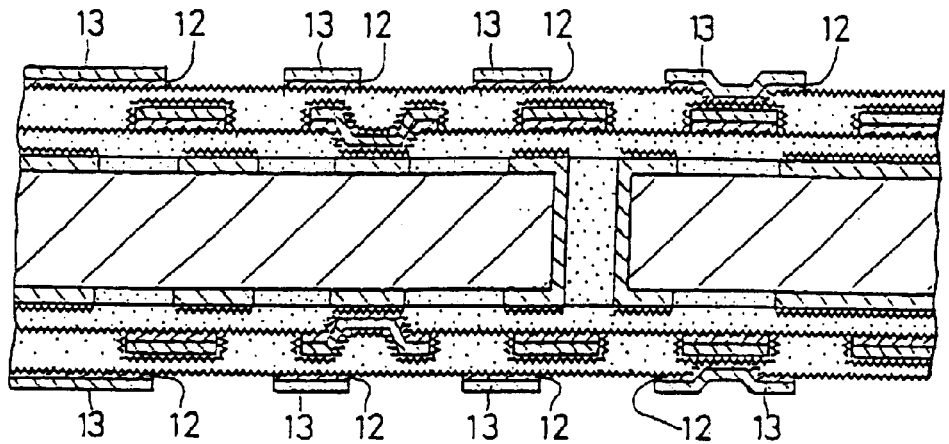

(9) Then, a roughened layer is formed on the surface of the conductor circuit (see FIG. 12).

As the method of forming the roughened layer, there are etching treatment, polishing treatment, redox treatment and plating treatment.

Among them, the redox treatment is conducted by using an oxidation aqueous solution of NaOH (10 g/l), $NaClO_2$ (40 g/l) and $Na_3PO_4$ (6 g/l) and a reduction aqueous solution of NaOH (10 g/l) and $NaBH_4$ (6 g/l).

Furthermore, the roughened layer made from copper-nickel-phosphorus alloy layer is formed by deposition through electroless plating.

As the electroless alloy plating aqueous solution, it is favorable to use a plating bath of aqueous solution composition comprising copper sulfate: 1~40 g/l, nickel sulfate: 0.1~6.0g/l, citric acid: 10~20 g/l, hypophosphite: 10~100 g/l, boric acid: 10~40 g/l and surfactant: 0.01~10 g/l.

In the invention, if necessary, it is desirable to cover the surface of the roughened layer with a layer of a metal having an ionization tendency of more than copper but less tan titanium or a noble metal.

In the case of tin, a solution of tin borofluoride-thiourea or tin chloride-thiourea is used. In this case, Sn layer having a thickness of about 0.1~21μm is formed through Cu—Sn substitution reaction.

In the case of the noble metal, there may be adopted sputtering method, vaporization method and the like.

(11) Then, an upper layer conductor circuit is formed by repeating steps (3)–(8)(see FIGS. 14–17). In this case, a roughened layer may be formed on the surfaces of the conductor circuits in the same manner as in the step (9), and it is particularly desirable that the roughened layer is formed on the surface of the conductor layer serving as an alignment mark and a pad for a solder bump formation. In view of the above, the printed circuit board may be formed by laminating a first interlaminar insulating layer on a conductor circuit of a substrate and repeating formation of conductor circuit and an interlaminar insulating layer on the first interlaminar insulating layer.

(12) Then, a solder resist composition is applied onto both surfaces of the thus obtained wiring substrate and the coating film of the solder resist composition is dried. Then, a photomask film depicted with an opening portion is placed on the dried film, which is subjected to light exposure and developing treatments to form an opening portion exposing a portion of the conductor layer serving as a pad portion for a solder bump formation and an alignment mark in the conductor circuit.

The opening size of the opening portion coresponding to the pad portion for the solder bump formation may be made larger than the diameter of the pad to completely expose the pad or may be made smaller than the diameter of the pad so as to cover the peripheral edge of the pad with the solder resist. Particularly, when the opening size is smaller than the diameter of the pad, the roughened layer on the pad surface is closely adhered to the solder resist, so that the pad can be restrained by the solder resist to prevent peeling of the pad.

On the other hand, the conductor layer serving as the alignment mark is covered at its peripheral edge with the solder resist so as not to completely expose the opening portion of the solder resist layer.

(13) Then, a metal layer of nickel-gold is formed on the pad portion exposed from the opening portion.

(14) Then, a solder body is fed onto the pad exposed from the opening portion.

As a method of feeding the solder body, use may be made of a solder transferring method and a solder printing method.

The solder transferring method is a method wherein a solder foil is attached to a prepreg and etched so as to leave only a portion corresponding to the opening portion to render into a solder carrier film having a solder pattern, and the solder carrier film is laminated so as to contact the solder pattern with the pad after a flux is applied to the opening portion in the solder resist of the substrate and heated to transfer the solder onto the pad. On the other hand, the solder printing method is a method wherein a metal mask having through-holes corresponding to the pads is placed onto the substrate and a solder paste is printed and heated.

The following examples are given in illustration of the invention and are not intended as limitations thereof.

EXAMPLE 1

(1) As a starting material, there is used a copper-clad laminate obtained by laminating a copper foil 8 of 18 µm on each surface of a substrate 1 made from a glass epoxy resin or BT (bismaleimide triazine) resin having a thickness of 0.6 mm (see FIG. 1). The copper foil 8 of the copper-clad laminate is etched in a pattern according to the usual manner, which is pierced and subjected to an electroless plating to form innerlayer conductor circuits 4 and through-holes 9 on both surfaces of the substrate (see FIG. 2).

Figure 3:
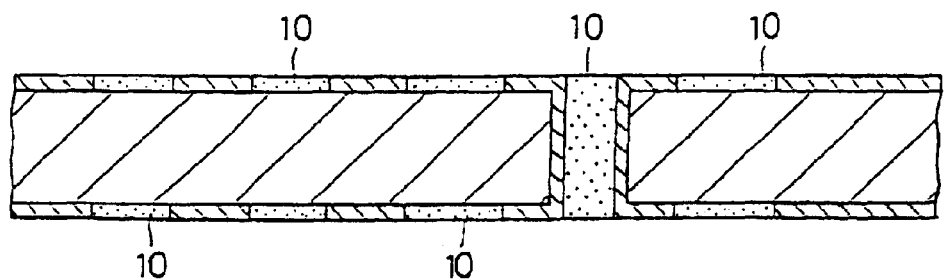
Figure 4:
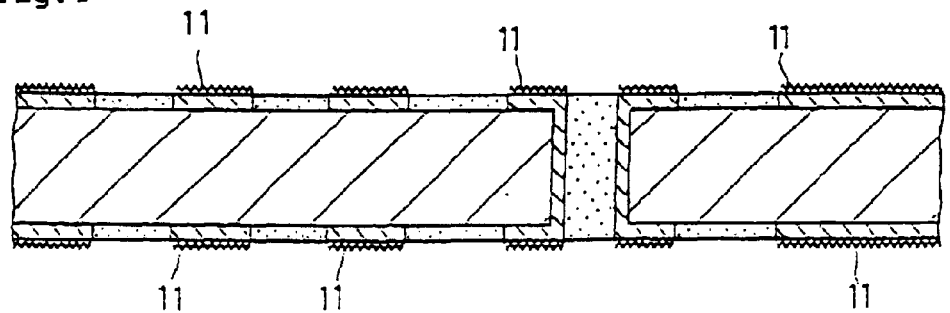

Further, bisphenol F epoxy resin is filled between the innerlayer conductor circuits 4 and in the through-holes 9 (see FIG. 3).

(2) The substrate treated in step (1) is washed with water, dried, acidically degreased and soft-etched. Then, the substrate is treated with a catalyst solution comprising palladium chloride and organic acid to give a Pd catalyst, which is activated and subjected to a plating in an electroless plating bath comprising 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 (uneven layer) of Cu—Ni—P alloy having a thickness of 2.5 µm on the surface of the copper conductor circuits 4 (see FIG. 4).

(3) A photosensitive adhesive solution (interlaminar resin insulating agent) is prepared by mixing 70 parts by weight of 25% acrylated product of cresol novolac epoxy resin (made by Nippon Kayaku Co., Ltd. molecular weight: 2500) dissolved in DMDG (diethylene glycol dimethyl ether), 30 parts by weight of polyether sulphone (PES), 4 parts by weight of an imidazole curing agent (made by Shikoku Kasei Co., Ltd. trade name: 2E4MZ-CN), 10 parts by weight of caprolacton-modified tris(acroxyethyl) isocyanurate (made by Toa Gosei Co., Ltd. trade name: Aronix M325) as a photosensitive monomer, 5 parts of benzophenone (made by Kanto Kagaku Co., Ltd.) as a photoinitiator, 0.5 parts by weight of Micheler's ketone (made by Kanto Kagaku Co., Ltd.) as a photosensitizer and 35 parts by weight at 5.5 µm on average and 5 parts by weight at 0.5 µm on average of epoxy resin particles, adding NMP (normal methyl pyrdlidone), adjusting a viscosity to 12 Pa·s in a homodisper agitating machine and kneading them through three rolls.

(4) The photosensitive adhesive solution obtained in step (3) is applied onto both surfaces of the substrate treated in step (2) by means of a roll coater and left to stand at a horizontal state for 20 minutes and dried at 60° C. for 30 minutes to form an adhesive layer 2 having a thickness of 60 µm (see FIG. 5).

(5) A photomask film depicted with viaholes is adhered onto each surface of the substrate provided with the adhesive layer 2 in step (4) and exposed by irradiation of ultraviolet ray.

(6) The substrate exposed in step (5) is developed by spraying DMTG (triethylene glycol dimethylether) solution to form openings for viaholes of 100 µmφ in the adhesive layer 2. Further, the substrate is exposed to a superhigh pressure mercury lamp at 3000 mJ/cm$^2$ and then heated at 100° C. for 1 hour and at 150° C. for 5 hours to form an adhesive layer 2 of 50 µm in thickness having the openings (opening 6 for the formation of viahole) with an excellent size accuracy corresponding to the photomask film (see FIG. 6). Moreover, the roughened layer 11 is partially exposed in the opening 6 for the viahole.

(7) The substrate provided with the openings 6 for the viaholes in steps (5), (6) is immersed in chromic acid for 2 minutes to dissolve and remove epoxy resin particles from the surface of the adhesive layer, whereby the surface of the adhesive layer 2 is roughened. Thereafter, it is immersed in a neutral solution (made by Shipley) and washed with water (see FIG. 7).

(8) A palladium catalyst (made by Atotec Co., Ltd.) is applied to the substrate subjected to a roughening treatment (roughening depth: 5 µm) in step (7) to give a catalyst nucleus to the surface of the adhesive layer 2 and the opening 6 for the viahole.

(9) The substrate is immersed in an electroless copper plating bath having the following composition to form an electroless copper plated film 12 having a thickness of 3 µm over the full roughened surface (see FIG. 8).

| [Electroless plating aqueous solution] | |
|---|---|
| EDTA | 150 g/l |
| Copper sulfate | 20 g/l |
| HCHO | 30 ml/l |
| NaOH | 40 g/l |
| α,α' bipyridyl | 80 mg/l |
| PEG | 0.1 g/l |

[Electroless Plating condition]

liquid temperature of 70° C., 30 minute

(10) A commercially available photosensitive dry film is attached to the electroless copper plated film 12 formed in step (9) and a photomask film is placed on the dry film, which is exposed to a light at 100 mJ/cm$^2$ and developed with a solution of 0.8% sodium carbonate to form a plating resist 3 having a thickness of 15 µm (see FIG. 9).

(11) Then, the non-resist forming portion is subjected to an electrolytic copper plating under the following conditions to form an electrolytic copper plated film 13 having a thickness of 15 µm (see FIG. 10).

| [Electrolytic plating aqueous solution] | |
| --- | --- |
| sulfuric aid | 180 g/l |
| copper sulfate | 80 g/l |
| additive (made by Atotech Japan Co., Ltd. trade name: Capalacido GL) | 1 ml/l |
| [Electrolytic plating condition] | |
| current density | 1 A/dm$^2$ |
| time | 30 minutes |
| temperature | room temperature |

(12) After the plating resist 3 is peeled and removed with 5% KOH, the electroless plated film 12 beneath the plating resist 3 is dissolved and removed by etching with a mixed solution of sulfuric acid and hydrogen peroxide to form conductor circuits 5 (including viaholes 7) of 18 μm in thickness comprised of the electroless copper plated film 12 and the electrolytic copper plated film 13 (see FIG. 11).

(13) The substrate provided with the conductor circuits 5 is immersed in an electroless plating aqueous solution comprising 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 of copper-nickel-phosphorus having a thickness of 3μm on the surface of the conductor circuit 5 (see FIG. 12). When the roughened layer 11 is analyzed by EPMA (electro probe microanalysis), it shows a composition ratio of Cu: 98 mol %, Ni: 1.5 mol % and P: 0.5 mol %.

(14) Steps (4)–(12) are repeated to further form upper layer conductor circuits (including viaholes and alignment marks) to thereby produce a wiring substrate (see FIGS. 13–17).

(15) On the other hand, a solder resist composition is prepared by mixing 46.67 g of a photosensitized oligomer (molecular weight: 4000) in which 50% of epoxy group in 60% by weight of cresol novolac epoxy resin (made by Nippon Kayaku Co., Ltd.) dissolved in DMDG is acrylated, 15.0 g of 80% by weight of bisphenol A epoxy resin (made by Yuka Shell Co., Ltd. trade name: Epikote 1001) dissolved in methyl ethyl ketone, 1.6 g of an imidazole curing agent (made by Shikoku Kasei Co., Ltd. trade name: 2E4MZ-CN), 3 g of a polyvalent acrylic monomer (made by Nippon Kayaku Co., Ltd. trade name: R604) as a photosensitive monomer, 1.5 g of a polyvalent acrylic monomer (made by Kyoeisha Kagaku Co., Ltd. trade name: DPE6A), 0.71 g of a dispersion type deforming agent (made by Sannopuko Co., Ltd. trade name: S-65), 2 g of benzophenone (made by Kanto Kagaku Co., Ltd.) as a photoinitiator and 0.2 g of Micheler's ketone (made by Kanto Kagaku Co., Ltd.) as a photosensitizer and adjusting a viscosity to 2.0 Pa·s at 25° C.

Moreover, the measurement of the viscosity is carried out by means of a B-type viscometer (made by Tokyo Keiki Co., Ltd. DVL-B model) with a rotor No. 4 in case of 60 rpm or a rotor No. 3 in case of 6 rpm.

(16) The above solder resist composition is applied onto the wiring substrate obtained in step (14) at a thickness of 20 μm. Then, the substrate is dried at 70° C. for 20 minutes and at 70° C. for 30 minutes and a photomask film is placed thereon and then exposed to ultraviolet rays at 1000 mJ/cm$^2$ and developed with DMTG. Further, it is heated at 80° C. for I hour, at 100° C. for 1 hour, at 120° C. for 1 hour and at 150° C. for 3 hours to form a solder resist layer 14 (thickness: 20 μm) opened in the pad portion (opening size: 200 μm).

(17) The substrate provided with the solder resist layer 14 is immersed in an electroless nickel plating solution of pH=5 comprising 30 g/l of nickel chloride, 10 g/l of sodium hypophosphite and 10 g/l of sodium citrate for 20 minutes to form a nickel plated layer 15 having a thickness of 5 μm in the opening portion. Further, the substrate is immersed in an electroless gold plating solution comprising 2 g/l of potassium gold cyanide, 75 g/l of ammonium chloride, 50 g/l of sodium citrate and 10 g/l of sodium hypophosphite at 93° C. for 23 seconds to form a gold plated layer 16 having a thickness of 0.03 μm on the nickel plated layer 15.

(18) A solder paste is printed on the opening portion of the solder resist layer 14 and reflowed at 200° C. to form solder bumps 17, whereby there is produced a printed circuit board having solder bumps 17.

EXAMPLE 2

A multilayer printed circuit board having solder bumps is produced in the same manner as in Example 1 except that the roughening of the conductor circuit is carried out by etching. In this case, an etching solution of Durabond (trade name, made by Meck Co., Ltd.) is used.

EXAMPLE 3

A multilayer printed circuit board having solder bumps is produced in the same manner as in Example I except that the roughening of the conductor circuit is carried out by etching. In this case, an etching solution of Durabond (trade name, made by Meck Co., Ltd.) is used. Further, an Au layer having a thickness of 0.54 μm is formed on the surface of the roughened layer by sputtering.

EXAMPLE 4

A multilayer printed circuit board having solder bumps is produced in the same manner as in Example 1 except that the roughening of the conductor circuit is carried out by etching. In this case, an etching solution of Durabond (trade name, made by Meck Co., Ltd.) is used. Further, Au layer having a thickness of 0.5 μm is formed on the surface of the roughened layer by spputtering.

EXAMPLE 5

A. Preparation of an Adhesive Composition for Electroless Plating

①. 35 parts by weight of a resin solution obtained by dissolving 25% acrylated product of cresol novolac epoxy resin (made by Nippon Kayaku Co., Ltd. molecular weight: 2500) in DMDG at a concentration of 80 wt % is mixed with 3.15 parts by weight of a photosensitive monomer (made by Toa Gosei Co., Ltd. trade name: Aronix M315), 0.5 parts by weight of a defoaming agent (made by Sannopuko Co., Ltd. trade name: S-65) and 3.6 parts by weight of NMP with stirring.

②. 12 parts by weight of polyether sulphone (PES) is mixed with 7.2 parts by weight at 1.0 μm on average and 3.09 parts by weight at 0.5 μm on average of epoxy resin particles (made by Sanyo Kasei Co., Ltd. trade name: Polymerpole) and further added with 30 parts by weight of NMP and mixed in a beads mill with stirring.

③. 2 parts by weight of an imidazole curing agent (made by Shikoku Kasei Co., Ltd. trade name: 2E-4MZ-CN) is mixed with 2 parts by weight of a photoinitiator (made by Ciba Geigey, trade name: Irgaquar I-907), 0.2 parts by weight of a photosensitizer (made by Nippon Kayaku Co., Ltd. trade name: DETX-S) and 1.5 parts by weight of NMP with stirring.

These mixtures are mixed to prepare an adhesive composition for electroless plating.

B. Preparation of an Underlayer Interlaminar Insulating Resin Material

①. 35 parts by weight of a resin solution obtained by dissolving 25% acrylated product of cresol novolac epoxy resin (made by Nippon Kayaku Co., Ltd. molecular weight: 2500) in DMDG at a concentration of 80 wt% is mixed with 4 parts by weight of a photosensitive monomer (made by Toa Gosei Co., Ltd. trade name: Aronix M3 15), 0.5 parts by weight of a defoaming agent (made by Sannopuko Co., Ltd. trade name: S-65) and 3.6 parts by weight of NMP with stirring.

②. 12 parts by weight of polyether sulphone (PES) is mixed with 14.49 parts by weight at 0.5 $\mu$m on average of epoxy resin particles (made by Sanyo Kasei Co., Ltd. trade name: Polymerpole) and further added with 30 parts by weight of NMP and mixed in a beads mill with stirring.

③. 2 parts by weight of an imidazole curing agent (made by Shikoku Kasei Co., Ltd. trade name: 2E-4MZ-CN) is mixed with 2 parts by weight of aphotoinitiator (made by Ciba Geigey, trade name: Irgaquar I-907), 0.2 parts by weight of a photosensitizer (made by Nippon Kayaku Co., Ltd. trade name: DETX-S) and 1.5 parts by weight of NMP with stirring.

These mixtures are mixed to prepare a resin composition used as an underlayer side insulating layer constituting the interlaminar insulating resin layer of two-layer structure.

C. Preparation of a Resin Filler

②. 100 parts by weight of bisphenol F epoxy monomer (made by Yuka Shell Co., Ltd. trade name: YL983U, molecular weight: 310), 170 parts by weight of $SiO_2$ spherical particles having an average particle size of 1.6 $\mu$m and coated on its surface with a silane coupling agent (made by Adomatic Co., Ltd. trade name: CRS 1101-CE, the maximum size of the particles is not more than the thickness (15 $\mu$m) of innerlayer copper pattern as mentioned below) and 1.5 parts by weight of a leveling agent (made by Sannopuko Co., Ltd. trade name: Perenol S4) are kneaded through three rolls and a viscosity thereof is adjusted to 45,000–49,000 cps at 23±1° C.

②. 6.5 parts by weight of an imidazole curing agent (made by Shikoku Kasei Co., Ltd. trade name: 2E4MZ-CN)

They are mixed to prepare a resin filler 10.

Figure 21:
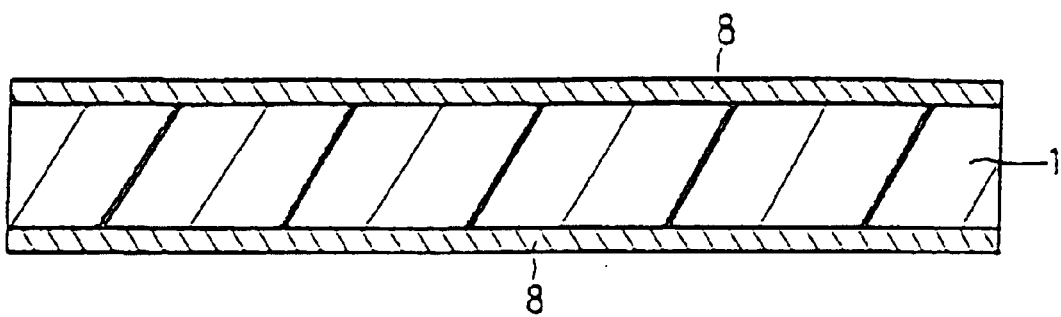
FIGS. 21–40 are flow charts showing production steps of a printed circuit board in Example 5.

D. Production of Printed Circuit Board (1) As a starting material, there is used a copper-clad laminate formed by laminating a copper foil 8 of 18 $\mu$m in thickness onto each surface of a substrate 1 made from glass epoxy resin or BT (bismaleimide triazine) resin and having a thickness of 1 mm (see FIG. 21). At first, the copper-clad laminate is drilled and a plating resist is formed thereon, which is subjected to an electroless plating treatment to form through-holes 9 and further the copper foil 8 is etched in a pattern according to the usual manner to form innerlayer copper patterns 4 on both surfaces of the substrate 1.

Figure 22:
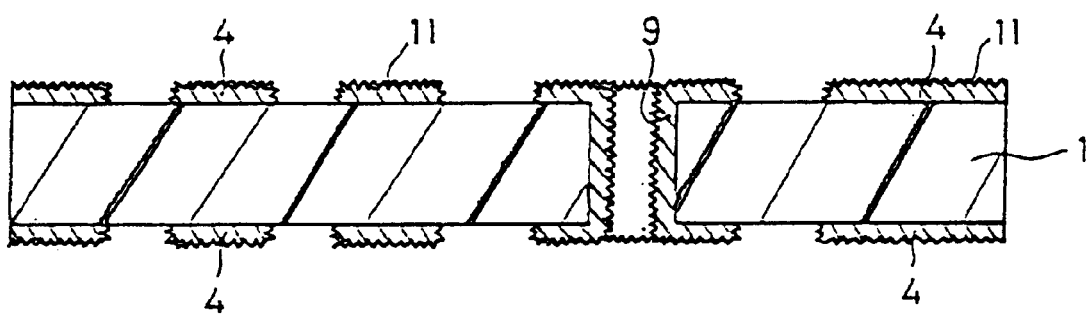

(2) The substrate provided with the innerlayer copper pattern 4 and through-hole 9 is washed with water, dried and subjected to a redox treatment using an oxidizing aqueous solution of NaOH (10 g/l), $NaClO_2$ (40 g/l) and $Na_3PO_4$ (6 g/l) and a reducing aqueous solution of NaOH (10 g/l) and $NaBH_4$ (6 g/l) to form a roughened layer 11 on the surfaces of the innerlayer copper pattern 4 and the through-hole 9 (see FIG. 22).

Figure 23:
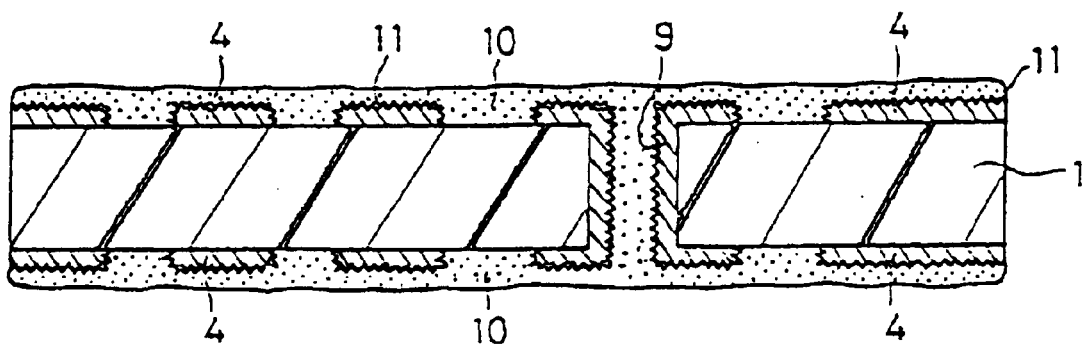

(3) The resin filler 10 is applied onto both surfaces of the substrate by means of a roll coater to fill between the conductor circuits 4 and in the through-holes 9 and dried at 70° C. for 20 minutes. Similarly, the resin filler 10 is filled between the conductor circuits 4 and in the through-hole 9 on the other-side surface and then dried by heating at 70° C. for 20 minutes (see FIG. 23).

(4) The one-side surface of the substrate treated in step (3) is polished by a belt sander polishing using #600 belt polishing paper (made by Sankyo Rikagaku Co., Ltd.) in such a manner that the resin filler is not left on the surface of the innerlayer copper pattern 4 or the land surface of the through-hole 9, and then buff-polished so as to remove scratches formed by the belt sander polishing. Such a series of polishings is applied to the other surface of the substrate.

Figure 24:
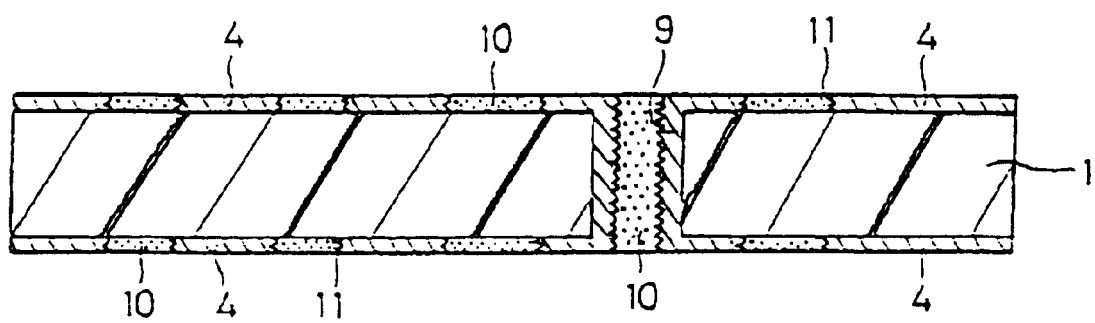

Then, the substrate is heated at 100° C. for 1 hour, at 120° C. for 3 hours, at 150° C. for 1 hour and at 180° C. for 7 hours to cure the resin filler 10 (see FIG. 24).

Thus, the roughened layers 11 formed on the surface layer portion of the resin filler 10 filled in the through-hole 9 and the like and on the upper surface of the innerlayer conductor circuits 4 are removed to smoothen both surfaces of the substrate, whereby there is obtained a wiring substrate wherein the resin filler 10 is strongly adhered to the side surface of the innerlayer conductor circuit 4 through the roughened layer 11 and the inner wall surface of the through-hole 9 is strongly adhered to the resin filler 10 through the roughened layer 11. That is, the surface of the resin filler 10 and the surface of the innerlayer copper pattern 4 are the same plane in this step. In this case, the curing resin filled has a Tg point of 155.6° C. and a linear thermal expansion coefficient of $44.5 \times 10^{-6}$/° C.

Figure 25:
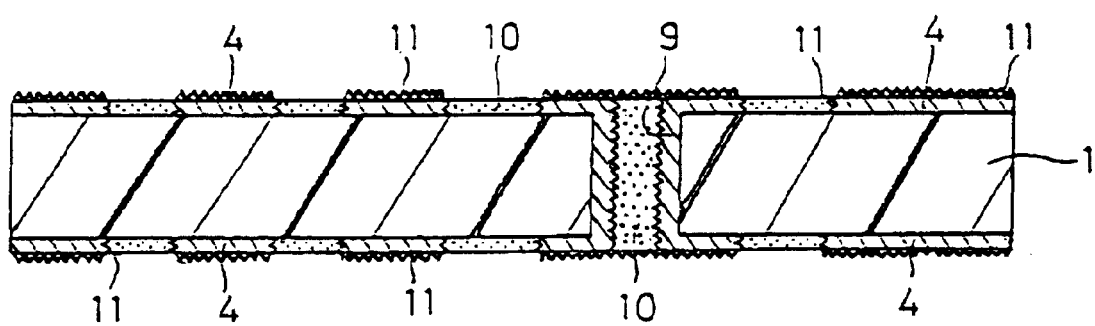

(5) A roughened layer (uneven layer) 11 of Cu—Ni—P alloy having a thickness of 2.5 $\mu$m is formed on the exposed surfaces of the innerlayer conductor circuit 4 and the land of the through-hole 9 of step (4) and further a Sn layer having a thickness of 0.3 $\mu$m is formed on the surface of the roughened layer 1.1 (see FIG. 25, provided that the Sn layer is not shown).

The formation method is as follows. That is, the substrate is acidically degreased and soft-etched and treated with a catalyst solution of palladium chloride and organic acid to give Pd catalyst, which is activated and subjected to a plating in an electroless plating bath of pH=9 comprising 8 g/l of copper sulfate, 0.6 g/l of nickel sulfate, 15 g/l of citric acid, 29 g/l of sodium hypophosphite, 31 g/l of boric acid, 0.1 g/l of surfactant and water to form the roughened layer 11 of Cu—Ni—P alloy on the upper surfaces of the copper conductor circuit 4 and land of through-hole 9. Then, Cu—Sn substitution reaction is carried out by immersing in a solution containing 0.1 mol/l of tin borofluoride and 1.0 mol/l of thiourea at a temperature of 50° C. and pH=1.2 to form the Sn layer of 0.3 $\mu$m on the surface of the roughened layer 11 (Sn layer is not shown).

(6) The interlaminar insulating resin material of item B (viscosity: 1.5 Pa·s) is applied onto both surfaces of the substrate treated in step (5) by means of a roll coater and left to stand at a horizontal state for 20 minutes and dried at 60° C. for 30 minutes (pre-baking) to form an insulating layer 2a.

Figure 26:
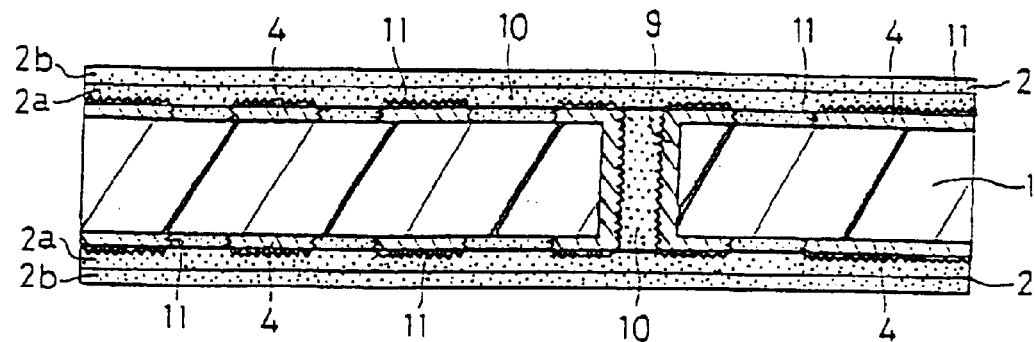

Further, the adhesive for electroless plating of item A (viscosity: 7 Pa·s) is applied onto the insulating layer 2a by means of a roll coater and left to stand at a horizontal state for 20 minutes and dried at 60° C. for 30 minutes (pre-baking) to form an adhesive layer 2b (see FIG. 26).

Figure 27:
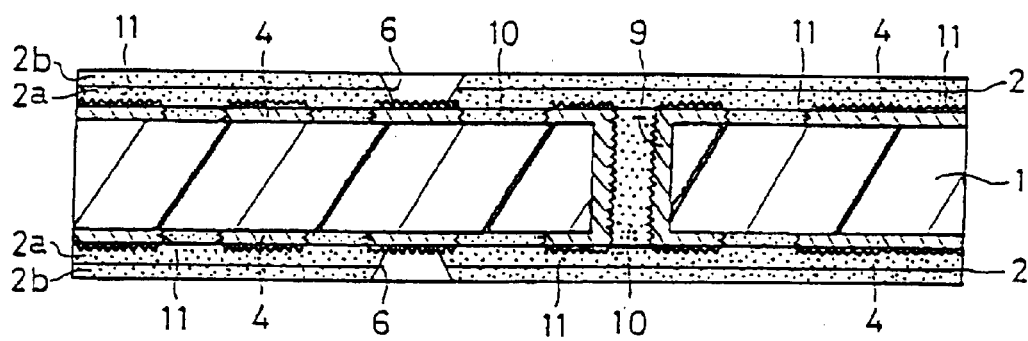

(7) A photomask film depicted with black circles of 85 $\mu$m in diameter is closely adhered onto both surfaces of the substrate provided with the insulating layer 2a and the adhesive layer 2b in step (6) and exposed to a superhigh pressure mercury lamp at 500 mJ/cm². It is developed by spraying DMTG solution and further exposed to a superhigh pressure mercury lamp at 3000 mJ/cm² and heated at 100° C. for 1 hour and at 150° C. for 5 hours (post baking) to form an interlaminar insulating resin layer (two-layer structure) of 35 μm in thickness having openings of 85 μm in diameter (openings 6 for the formation of viaholes) with an excellent size accuracy corresponding to the photomask film (see FIG. 27). Moreover, the tin plated layer is partially exposed in the opening for viahole.

Figure 28:
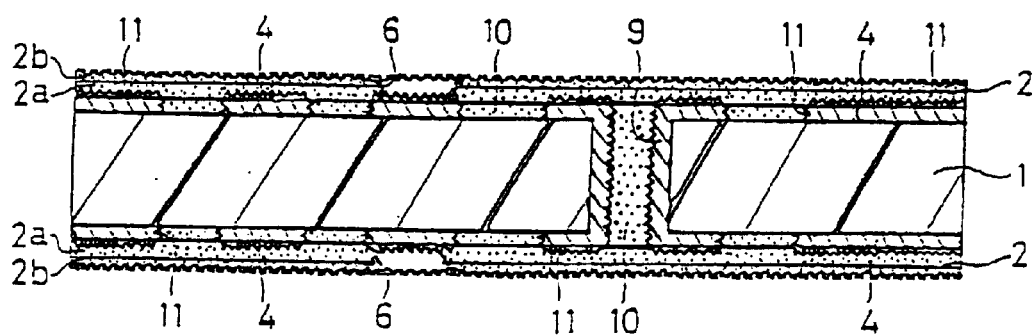

(8) The substrate provided with the openings is immersed in 800 g/l of chromic acid at 70° C. for 19 minutes to dissolve and remove the epoxy resin particles existing on the surface of the adhesive layer 2b in the interlaminar insulating resin layer 2, whereby the surface of the interlaminar insulating resin layer 2 is roughened (depth: 3 μm) and thereafter the substrate is immersed in a neutral solution (made by Shipley) and washed with water (see FIG. 28).

Further, a palladium catalyst (made by Atotec Co., Ltd.) is applied to the roughened surface of the substrate to give a catalyst nucleus to the surface of the interlaminar insulating resin layer 2 and the inner wall surface of the opening 6 for viahole.

Figure 29:
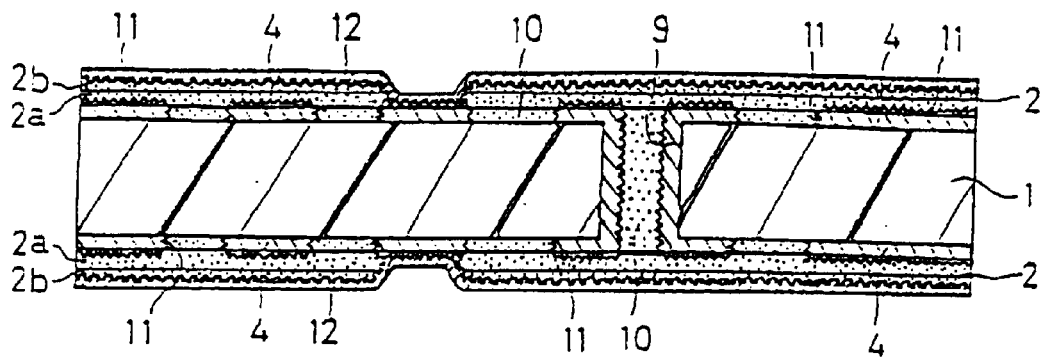

(9) The substrate is immersed in an electroless copper plating bath having the following composition to form an electroless copper plated film 12 having a thickness of 0.6 μm on the full roughened surface (see FIG. 29).

| [Electroless plating aqueous solution] | |
| --- | --- |
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

[Electroless plating condition]

liquid temperature of 70° C., 30 minutes

Figure 30:
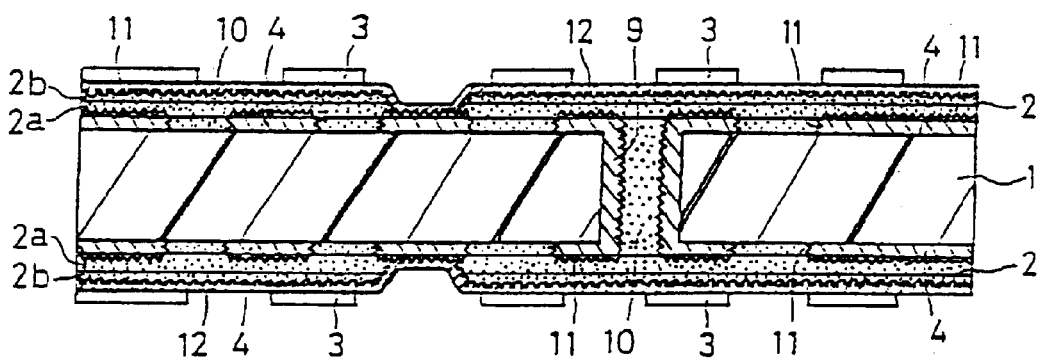

(10) A commercially available photosensitive dry film is adhered to the electroless copper plated film 12 formed in step (9) and a mask is placed thereon and exposed to a light at 100 mJ/cm² and developed with 0.8% of sodium carbonate to form a plating resist 3 having a thickness of 15 μm (see FIG. 30).

Figure 31:
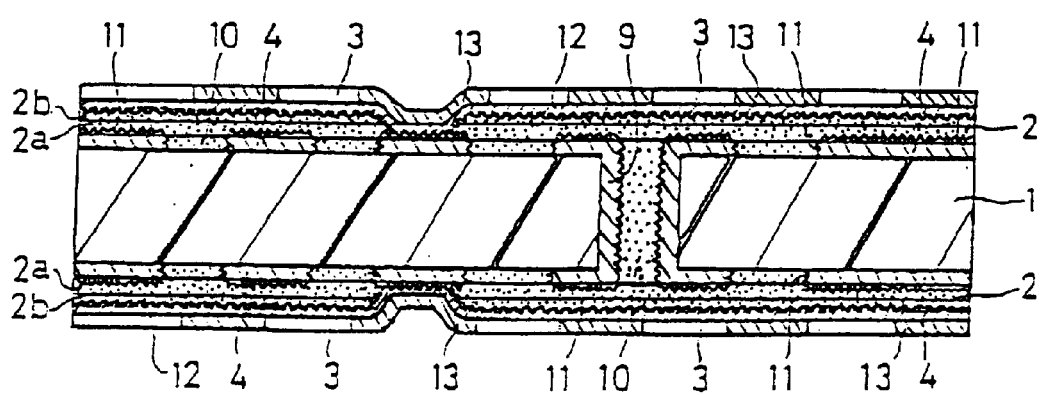

(11) Then, the non-resist forming portion is subjected to an electrolytic copper plating under the following conditions to form an electrolytic copper plated film 13 having a thickness of 15 μm (see FIG. 31).

| [Electrolytic plating aqueous solution] | |
| --- | --- |
| Sulfuric acid | 180 g/l |
| Copper sulfate | 80 g/l |
| Additive (made by Atotec Japan. Co., Ltd. trade name: Capalacid GL) | 1 ml/l |
| [Electrolytic plating condition] | |
| current density | 1 A/dm² |
| time | 30 minutes |
| temperature | Room temperature |

Figure 32:
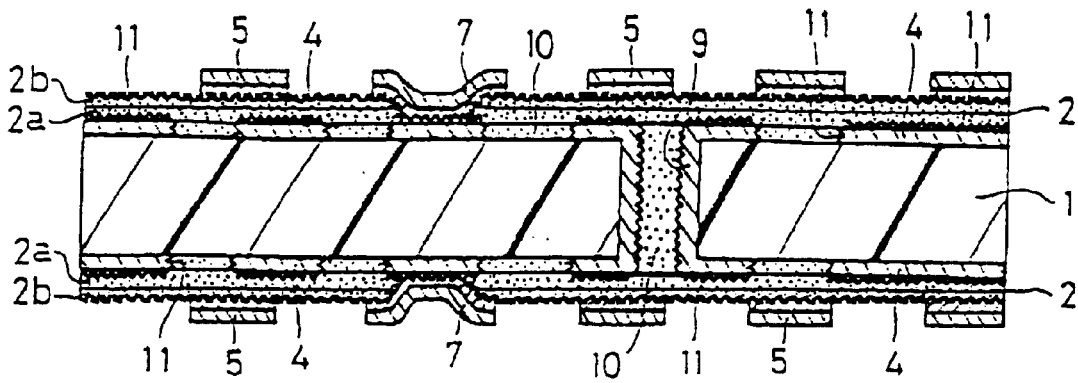

(12) After the plating resist 3 is peeled off with 5% KOH, the electroless plated film 12 beneath the plating resist 3 is dissolved and removed by etching with a mixed solution of sulfuric acid and hydrogen peroxide to form conductor circuit 5 (including viahole) of 18 μm in thickness comprised of the electroless copper plated film 12 and the electrolytic copper plated film 13. Further, it is immersed in 800 g/l of chromic acid at 70° C. for 3 minutes to etch the surface of the adhesive layer for electroless plating between conductor circuits located at the portion not forming the conductor circuit by 1~2 μm to thereby remove the palladium catalyst remaining on the surface (see FIG. 32).

Figure 33:
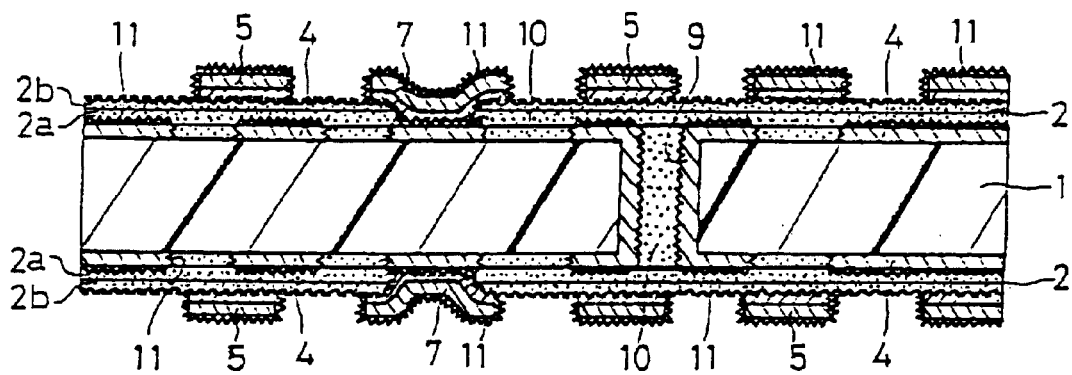
Figure 34:
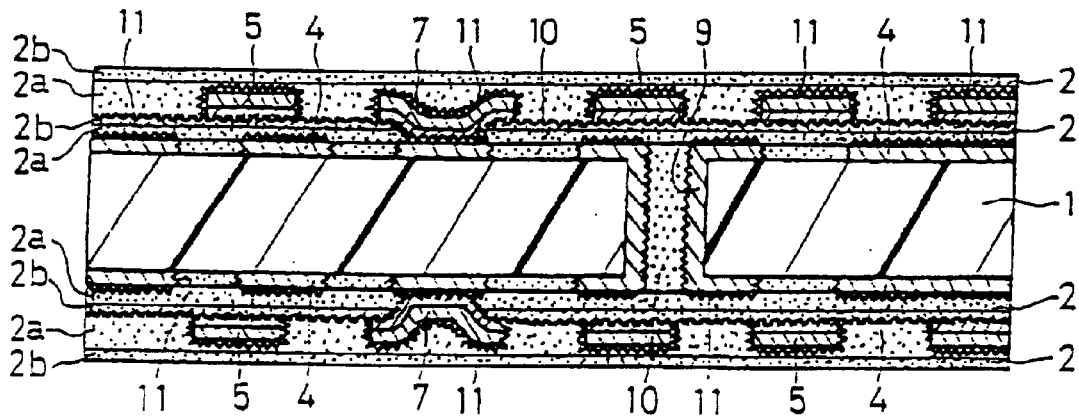
Figure 35:
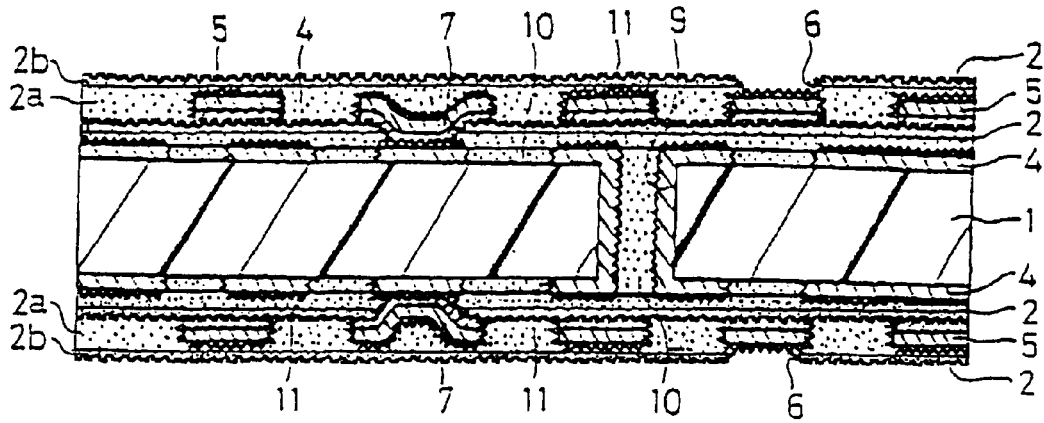
Figure 36:
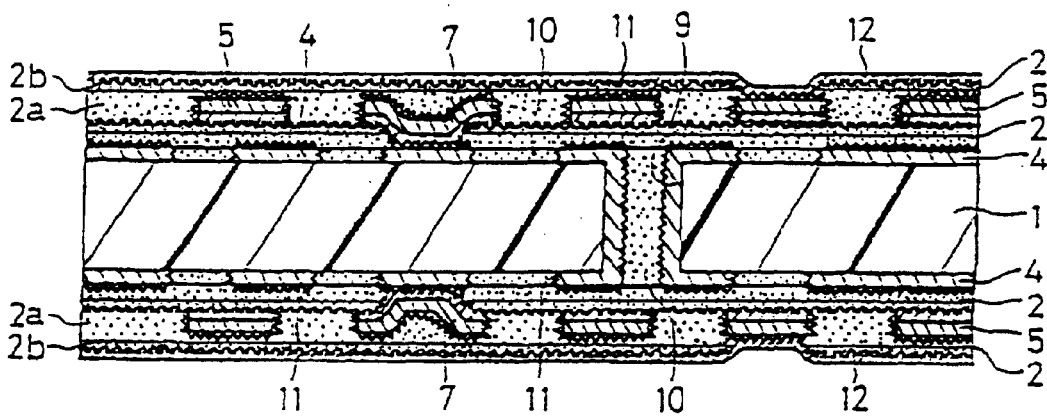
Figure 37:
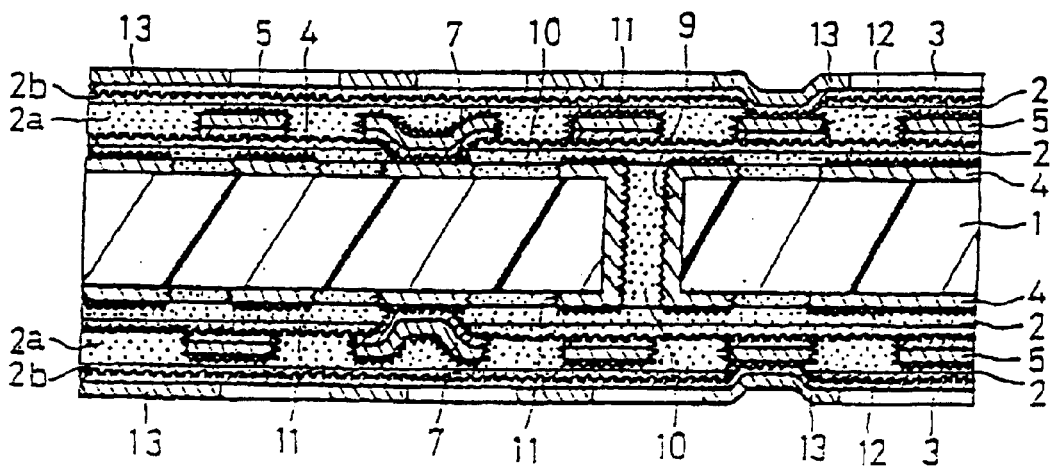
Figure 38:
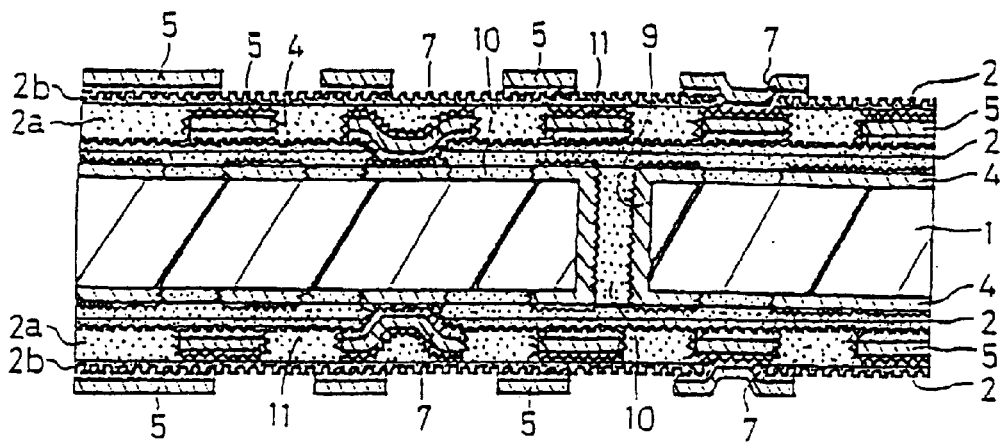
Figure 39:
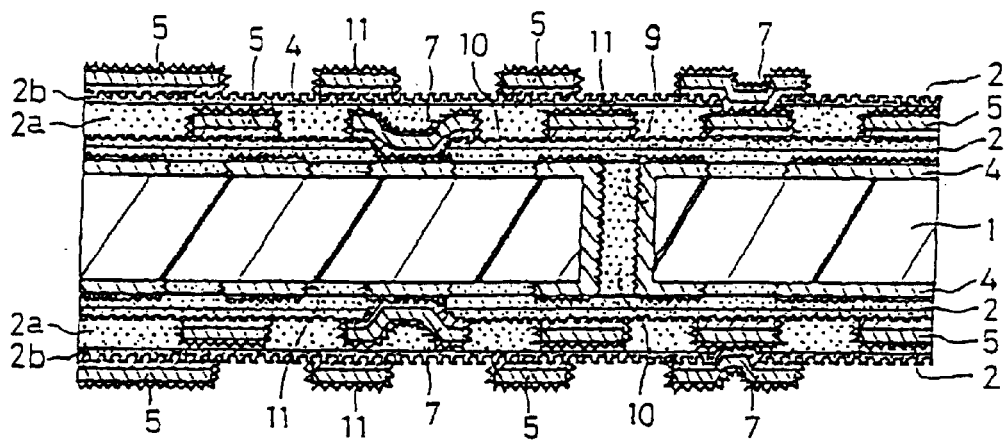

(13) The substrate provided with the conductor circuits 5 is immersed in an electroless plating aqueous solution of pH=9 comprising 8 g/l of copper sulfate, 0.6 g/l of nickel sulfate, 15 g/l of citric acid, 29 g/l of sodium hypophosphite, 31 g/l of boric acid and 0.1 g/l of surfactant to form a roughened layer 11 of copper-nickel-phosphorus having a thickness of 3 μm on the surface of the conductor circuit 5 (see FIG. 33). In this case, the resulting roughened layer 11 has a composition ratio of Cu: 98 mol %, Ni: 1.5 mol % and P: 0.5 mol % as analyzed by EPMA (electro probe microanalysis).

Further, Cu—Sn substitution reaction is carried out by immersing in a solution of 0.1 mol/l of tin borofluoride and 1.0 mol/l of thiourea at a temperature of 50° C. and pH=1.2 to form a Sn layer having a thickness of 0.3 μm on the surface of the roughened layer 11 (the Sn layer is not shown).

(14) Steps (6)–(13) are repeated to further form upper layer conductor circuits (including viaholes and alignment marks) to thereby produce a multilayer wiring substrate. However, Sn substitution is not conducted (see FIGS. 34–39).

(15) On the other hand, a solder resist composition is prepared by mixing 46.67 g of a photosensitized oligomer (molecular weight: 4000) in which 50% of epoxy group in 60% by weight of cresol novolac epoxy resin (made by Nippon Kayaku Co., Ltd.) dissolved in DMDG is acrylated, 15.0 g of 80% by weight of bisphenol A epoxy resin (made by Yuka Shell Co., Ltd. trade name: Epikote 1001) dissolved in methyl ethyl ketone, 1.6 g of an imidazole curing agent (made by Shikoku Kasei Co., Ltd. trade name: 2E4MZ-CN), 3 g of a polyvalent acrylic monomer (made by Nippon Kayaku Co., Ltd. trade name: R604) as a photosensitive monomer, 1.5 g of a polyvalent acrylic monomer (made by Kyoeisha Kagaku Co., Ltd. trade name: DPE6A), 0.71 g of a dispersion type deforming agent (made by Sannopuko Co., Ltd. trade name: S-65), 2 g of benzophenone (made by Kanto Kagaku Co., Ltd.) as a photoinitiator and 0.2 g of Micheler's ketone (made by Kanto Kagaku Co., Ltd.) as a photosensitizer and adjusting a viscosity to 2.0 Pa·s at 25° C.

Moreover, the measurement of the viscosity is carried out by means of a B-type viscometer (made by Tokyo Keiki Co., Ltd. DVL-B model) with a rotor No. 4 in case of 60 rpm or a rotor No. 3 in case of 6 rpm.

(16) The above solder resist composition is applied onto both surfaces of the multilayer wiring substrate obtained in step (14) at a thickness of 20 μm. Then, the substrate is dried at 70° C. for 20 minutes and at 70° C. for 30 minutes and a photomask film of 5 mm in thickness depicted with a circle pattern (mask pattern) is placed thereon and then exposed to ultraviolet rays at 1000 mJ/cm² and developed with DMTG. Further, it is heated at 80° C. for 1 hour, at 100° C. for 1 hour, at 120° C. for 1 hour and at 150° C. for 3 hours to form a solder resist layer 14 (thickness: 20 μm) opened in the pad portion (including viahole and its land portion, opening size: 200 μm).

(17) The substrate provided with the solder resist layer 14 is immersed in an electroless nickel plating aqueous solution of pH=5 comprising 30 g/l of nickel chloride, 10 g/l of sodium hypophosphite and 10 g/l of sodium citrate for 20 minutes to form a nickel plated layer 15 having a thickness of 5 μm in the opening portion. Further, the substrate is immersed in an electroless gold plating aqueous solution comprising 2 g/l of potassium gold cyanide, 75 g/l of ammonium chloride, 50 g/l of sodium citrate and 10 g/l of sodium hypophosphite at 93° C. for 23 seconds to form a gold plated layer 16 having a thickness of 0.03 μm on the nickel plated layer 15.

Figure 40:
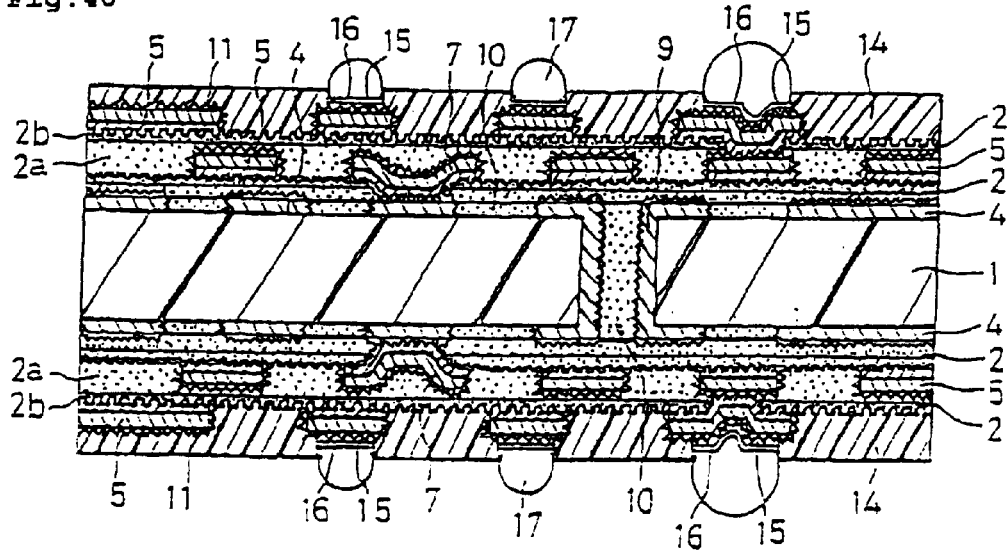

(18) A solder paste is printed on the opening portion of the solder resist layer 14 and reflowed at 200° C. to form solder bumps 17 (solder body), whereby there is produced a printed circuit board having solder bumps (see FIG. 40).

EXAMPLE 6

A printed circuit board having solder bumps is produced in the same manner as in Example 5 except that a metal film is formed at the following conditions instead of tin substitution.

(6-1) Ti is adhered on the substrate at an atmospheric pressure of 0.6 Pa, a temperature of 100° C., an electric power of 200 W and a time of 2 minutes. Then, Ti film existing between conductor circuits is etched by chromic acid with resin.

(6-2) Al is adhered on the substrate at an atmospheric pressure of 0.5 Pa, a temperature of 100° C., an electric power of 200 W and a time of 1 minute. Then, Al film existing between conductor circuits is etched by chromic acid with resin.

(6-3) Zn is adhered on the substrate at an atmospheric pressure of 0.6 Pa, a temperature of 100° C., an electric power of 200 W and a time of 2 minutes. Then, Zn film existing between conductor circuits is etched by chromic acid with resin.

(6-4) Fe is adhered on the substrate at an atmospheric pressure of 0.6 Pa, a temperature of 100° C., an electric power of 200 W and a time of 2 minutes. Then, Fe film existing between conductor circuits is etched by chromic acid with resin.

(6-5) In is adhered on the substrate at an atmospheric pressure of 0.6 Pa, a temperature of 100° C, an electric power of 200 W and a time of 2 minutes. Then, In film existing between conductor circuits is etched by chromic acid with resin.

(6-6) Al is adhered on the substrate at an atmospheric pressure of 0.6 Pa, a temperature of 100° C., an electric power of 200 W and a time of 2 minutes. Then, Al film existing between conductor circuits is etched by chromic acid with resin.

(6-7) Ni is adhered on the substrate at an atmospheric pressure of 0.6 Pa, a temperature of 100° C., an electric power of 200 W and a time of 2 minutes. Then, Ni film existing between conductor circuits is etched by chromic acid with resin.

(6-8) The substrate is immersed in an aqueous solution of lead oxide (3.75 g/l), sodium cyanide (26.3 g/l) and sodium hydroxide (105 g/l) as an electroless plating aqueous solution to deposit on the surface of the roughened layer.

(6-9) Bi is adhered on the substrate at an atmospheric pressure of 0.6 Pa, a temperature of 100° C., an electric power of 200 W and a time of 2 minutes. Then, Bi film existing between conductor circuits is etched by chromic acid with resin.

(6-10) Tl is adhered on the substrate at an atmospheric pressure of 0.6 Pa, a temperature of 100° C., an electric power of 200 w and a time of 2 minutes. Then, Tl film existing between conductor circuits is etched by chromic acid with resin.

COMPARATIVE EXAMPLE 1

A dry film photo-resist is laminated on the substrate treated in steps(1)–(8) of Example 1, and exposed and developed to form a plating resist. Then, after step (9) of Example 1 is carried out, the plating resist is peeled and removed in the same manner as in step (12) and the whole surface of the conductor circuit is roughened by step (13) of Example 1. Thereafter, the formation of interlaminar insulating resin layer, roughening treatment, the formation of plating resist and electroless copper plating are carried out in the same manner as in Example 1, and after the plating resist is peeled and removed, a multi layer printed circuit board having solder bumps is produced by carrying out steps (15)–(19) of Example 1.

COMPARATIVE EXAMPLE 2

A multilayer printed circuit board having solder bumps is produced in the same manner as in Example 1 except that after the roughening of the conductor circuit, Cu—Sn substitution reaction is carried out by immersing in a solution of 0.1 mol/l of tin borofluoride and 1.0 mol/l of thiourea at a temperature of 50° C. and pH=1.2 to form a Sn layer having a thickness of 0.3 μm on the surface of the roughened layer (the Sn layer is not shown).

After IC chip is mounted onto each of the printed circuit boards of the Examples and Comparative Examples, heat cycle tests of 1000 cycles and 2000 cycles under conditions of −55° C. for 15 minutes, room temperature for 10 minutes and 125° C. for 15 minutes are carried out.

The evaluation of these tests are carried out by confirming occurrences of cracks in the multilayer printed circuit board by means of a scanning electron microscope after the test. Further, the presence or absence of the peeling at the boundary between viahole and a lower conductor circuit layer is confirmed in the same manner. Furthermore, the peel strength is measured according to JIS-C-6481.

The results are shown in Table 1. As seen from the results of this table, the occurrence of cracks is not observed at about 1000 cycles in the Examples and Comparative Examples, while the occurrence of cracks is observed at 2000 cycles in the Comparative Examples. Further, the peel strength is equal or higher than that of the conductor circuit comprised of only an electroless plated film.

Thus, in the invention, cracks of the interlaminar insulating resin layer and peeling at the boundary between viahole and a lower conductor circuit caused in the heat cycle can be prevented while maintaining a practical peel strength.

Further, the presence or absence of dissolution of the conductor circuit due to the local electrode reaction is observed by means of an optical microscope. The results are shown in Table 1 with the results of the heat cycle test. As seen from the results of Table 1, in Examples wherein the surface of the roughened layer is covered with a layer of a metal having an ionization tendency of more than copper but less than titanium or a noble metal, dissolution of the conductor circuit due to the local electrode reaction can be controlled.

TABLE 1

| | Heat cycle test | | | | Peel strength | Dissolution of conductor circuit |
|---|---|---|---|---|---|---|
| | Crack of interlaminar insulating resin layer | | Peeling of viahole | | | |
| | 1000 cycles | 2000 cycles | 1000 cycles | 2000 cycles | | |
| Example | | | | | | |
| 1 | none | none | none | none | 1.2 kg/cm | presence |
| 2 | none | none | none | none | 1.2 kg/cm | presence |
| 3 | none | none | none | none | 1.2 kg/cm | none |
| 4 | none | none | none | none | 1.0 kg/cm | none |
| 5 | none | none | none | none | 1.0 kg/cm | none |
| 6-1 | none | none | none | none | 1.0 kg/cm | none |
| 6-2 | none | none | none | none | 1.0 kg/cm | none |
| 6-3 | none | none | none | none | 1.0 kg/cm | none |
| 6-4 | none | none | none | none | 1.0 kg/cm | none |
| 6-5 | none | none | none | none | 1.0 kg/cm | none |
| 6-6 | none | none | none | none | 1.0 kg/cm | none |
| 6-7 | none | none | none | none | 1.0 kg/cm | none |
| 6-8 | none | none | none | none | 1.0 kg/cm | none |
| 6-9 | none | none | none | none | 1.0 kg/cm | none |
| 6-10 | none | none | none | none | 1.0 kg/cm | none |
| Comparative Example 1 | none | presence | none | presence | 0.9 kg/cm | presence |
| Comparative Example 2 | none | presence | none | presence | 0.9 kg/cm | none |

INDUSTRIAL APPLICABILITY

As mentioned above, according to the invention, it is possible to prevent the occurrence of cracks and the conductor peeling in the interlaminar insulating layer and dissolution of the conductor circuit due to the local electrode reaction, so that it is possible to surely improve connection reliability of the printed circuit board.

What is claimed is:

1. A multilayer printed circuit board comprising a plurality of interlaminar insulating layers and conductor circuits, said printed circuit board being formed by laminating a first interlaminar insulating layer on a conductor circuit of a substrate and forming at least a second conductor circuit and a second interlaminar insulating layer on the first interlaminar insulating layer, wherein the conductor circuits are comprised of an electroless plated film and an electrolytic plated film, and a roughened layer formed by a roughening treatment on at least a part of the surface of the conductor circuits.

2. A printed circuit board according to clam 1, wherein the roughened layer is on at least a part of the surface inclusive of a side surface of the conductor circuit.

3. A printed circuit board according to claim 1, wherein the roughened layer is on at least a part of a side face of the conductor circuit.

4. A printed circuit board according to claim 1, wherein the roughened layer is a plated layer of copper-nickel-phosphorus alloy.

5. The printed circuit board according to claim 1, wherein the electrolytic plated film is formed on the electroless plated film.

6. A printed circuit board according to claim 1, wherein the roughening treatment comprises etching treatment, polishing treatment, redox treatment, or plating treatment.

7. A printed circuit board according to claim 1, wherein the electroless plated film comprises an inner layer side and the electrolytic plated film comprises an outer layer side and the roughened layer is formed on the electrolytic plated film.

8. A printed circuit board according to claim 2, wherein the roughened layer is a plated layer of copper-nickel-phosphorus alloy.

9. A printed circuit board according to claim 3, wherein the roughened layer is a plated layer of copper-nickel-phosphorus alloy.

10. A multilayer printed circuit board comprising a plurality of interlaminar insulating layers and conductor circuits, said printed circuit board being formed by laminating a first interlaminar insulating layer on a conductor circuit of a substrate and forming at least a second conductor circuit and a second interlaminar insulating layer on the first interlaminar insulating layer, wherein the conductor circuits are comprised of an electroless plated film and an electrolytic plated film, and a roughened layer formed by a roughening treatment on at least a part of the surface of the conductor circuits, and the surface of the roughened layer is covered with a layer of a metal having an ionization tendency of more than copper but not higher than titanium, or of a noble metal.

11. A printed circuit board according to claim 10, wherein the roughened layer is on at least a part of the surface inclusive of a side surface of the conductor circuit.

12. A printed circuit board according to claim 10, wherein the roughened layer is on at least a part of a side face of the conductor circuit.

13. A painted circuit board according to claim 10, wherein the roughened layer is a plated layer of copper-nickel-phosphorus alloy.

14. The printed circuit board according to claim 10, wherein the electrolytic plated film is formed on the electroless plated film.

15. A printed circuit board according to claim 10, wherein the roughening treatment comprises etching treatment, polishing treatment, redox treatment, or plating treatment.

16. A printed circuit board according to claim 10, wherein the electroless plated film comprises an inner layer side and the electrolytic plated film comprises an outer layer side and the roughened layer is formed on the electrolytic plated film.

17. A multilayer printed circuit board comprising a substrate provided wit an under layer conductor circuit, an interlaminar insulating layer formed thereon and an upper layer conductor circuit formed on the interlaminar insulating layer, and a viahole connecting both the conductor circuits to each other, in which the viahole is comprised of an electroless plated film and an electrolytic plated film, and a roughened layer an at least a part of the surface of the under layer conductor circuit connected to the viahole, said roughened layer having a roughened surface formed by etching treatment, polishing treatment, redox treatment or plating treatment.

18. A multilayer printed circuit board according to claim 17, wherein the roughened layer is formed by plating of copper-nickel-phosphorus alloy.

19. The printed circuit board according to claim 17, wherein the electrolytic film is formed on the electroless plated film.

20. A printed circuit board according to claim 17, wherein the electroless plated film comprises an inner layer side and the electrolytic plated film comprises an outer layer side and the roughened layer is formed on the electrolytic plated film.

21. A method of producing a multilayer printed circuit board comprising subjecting a surface of a substrate to an electroless plating, forming a plating resist thereon, subjecting the substrate to an electrolytic plating, removing the plating resist, etching and removing the electroless plated film beneath the plating resist to form a conductor circuit comprised of the electroless plated film and the electrolytic plated film, forming a roughened layer on at least a part of the surface of the conductor circuit and in forming an interlaminar insulating layer.

22. A method of producing a printed circuit board according to claim 21, wherein the roughened layer is formed by plating of copper-nickel-phosphorus alloy.

23. The method according to claim 21, wherein the electrolytic film is formed on the electroless plated film.

24. A method of producing a multilayer printed circuit board comprising subjecting a surface of a substrate to an electroless plating fining a plating resist thereon, subjecting the substrate to an electrolytic plating, removing the plating resist, etching and removing the electroless plated film beneath the plating resist to form a conductor circuit comprised of the electroless plated film and the electrolytic plated film, forming a roughened layer on at least apart of the surface of the conductor circuit, covering the surface of the roughened layer with a layer of a metal having an ionization tendency of more than copper but not higher than titanium, or of a noble metal, and forming an interlaminar insulating layer.

25. A method of producing a printed circuit board according to claim 24, wherein the roughened layer is formed by plating of copper-nickel-phosphorus alloy.

26. The method according to claim 24, wherein the electrolytic film is formed on the electroless plated film.

27. A rod of producing a multilayer printed circuit board comprising forming a lower conductor circuit layer on a surface of a substrate, forming a roughened layer by etching treatment, polishing treatment, redox treatment, or plating treatment on at least a part of the surface of the underlayer conductor circuit connected to a viahole, forming an interlaminar insulating layer thereon, forming openings for viaholes in the interlaminar insulating layer, subjecting the interlaminar insulating layer to an electroless plating, forming a plating resist thereon, subjecting the interlaminar insulating layer to an electrolytic plating, removing the plating resist, etching and removing the electroless plated film beneath the plating resist to form an upperlayer conductor circuit comprised of the electroless plated film and the electrolytic plated film and a viahole.

28. A method of producing a multilayer printed circuit board according to claim 27, wherein the roughened layer is formed r eating of copper-nickel-phosphorus alloy.

29. The method according to claim 27, wherein the electrolytic film is formed on the electroless plated film.

* * * * *

UNITED STATES PATENT AND TRADEMARK OFFICE
CERTIFICATE OF CORRECTION

PATENT NO. : 6,835,895 B1
DATED : December 28, 2004
INVENTOR(S) : M. Asai et al.

It is certified that error appears in the above-identified patent and that said Letters Patent is hereby corrected as shown below:

Column 24,
Line 66, "wit" should be -- with --.

Column 25,
Line 5, "an" should be -- on --.
Line 28, "in" should be -- then --.
Line 37, "plating fining" should be -- plating, forming --.

Column 26,
Line 5, "apart" should be -- a part --.
Line 16, "rod" should be -- method --.
Line 33, "r eating" should be -- by plating --.

Signed and Sealed this

Twenty-third Day of August, 2005

JON W. DUDAS
*Director of the United States Patent and Trademark Office*